United States Patent
Asakawa et al.

(10) Patent No.: US 6,649,516 B2
(45) Date of Patent: Nov. 18, 2003

(54) METHOD FOR MANUFACTURING A COMPOSITE MEMBER FROM A POROUS SUBSTRATE BY SELECTIVELY INFILTRATING CONDUCTIVE MATERIAL INTO THE SUBSTRATE TO FORM VIA AND WIRING REGIONS

(75) Inventors: Koji Asakawa, Kawasaki (JP); Yasuyuki Hotta, Tokyo (JP); Shigeru Matake, Yokohama (JP); Toshiro Hiraoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/161,707

(22) Filed: Jun. 5, 2002

(65) Prior Publication Data

US 2002/0197834 A1 Dec. 26, 2002

(30) Foreign Application Priority Data

Jun. 5, 2001 (JP) .......................... 2001-170018
Sep. 27, 2001 (JP) .......................... 2001-295461

(51) Int. Cl.⁷ ................................................ H05K 3/10
(52) U.S. Cl. .......................... 438/638; 29/846; 29/880; 200/264; 361/748
(58) Field of Search ............................ 438/638; 29/829, 29/846, 880; 174/262; 200/264; 361/748

(56) References Cited

U.S. PATENT DOCUMENTS 4,895,756 A * 1/1990 Suzuki ..................... 428/317.9
5,819,858 A * 10/1998 Nechansky ................. 174/252
6,504,685 B1 * 1/2003 Wachtler et al. ......... 360/294.3
2002/0157862 A1 * 10/2002 Nishii ......................... 174/255

FOREIGN PATENT DOCUMENTS

| JP | 7-207450 A | 8/1995 |
| JP | 10-149722 A | 6/1998 |
| JP | 11-25755 A | 1/1999 |

OTHER PUBLICATIONS

U.S. patent application Ser. No. 10/161,707, Asakawa et al., filed Jun. 5, 2002.

U.S. patent application Ser. No. 10/251,825, Hiraoka et al., filed Sep. 23, 2002.

* cited by examiner

Primary Examiner—Carl Whitehead, Jr.
Assistant Examiner—Stephen W. Smoot
(74) Attorney, Agent, or Firm—Oblon, Spivak, McClelland, Maier & Neustadt, P.C.

(57) ABSTRACT

Disclosed is a method for manufacturing a composite member comprising a porous substrate, a via, and a wiring. The method comprises exposing a first region and a second region in the porous substrate to a exposure beam through a mask, the second region exposed by the exposure beam not more than 50% of the exposure of the first region, the exposure beam having the wavelength that an average size of voids of the porous substrate is, as expressed by a radius of gyration, 1/20 to 10 times, and forming the via and the wiring by infiltrating a conductive material into the first region and the second region respectively.

20 Claims, 8 Drawing Sheets

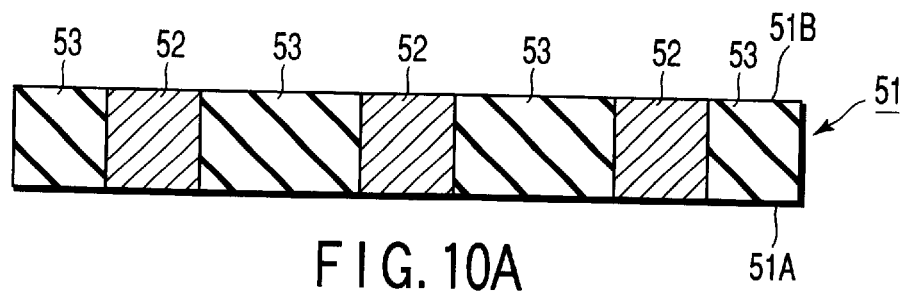
F I G. 10A
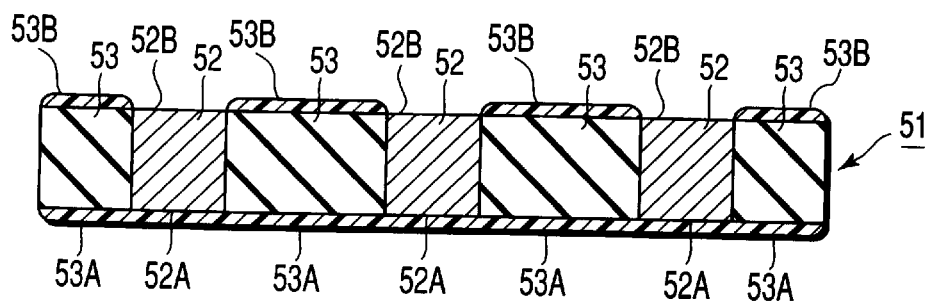
F I G. 10B
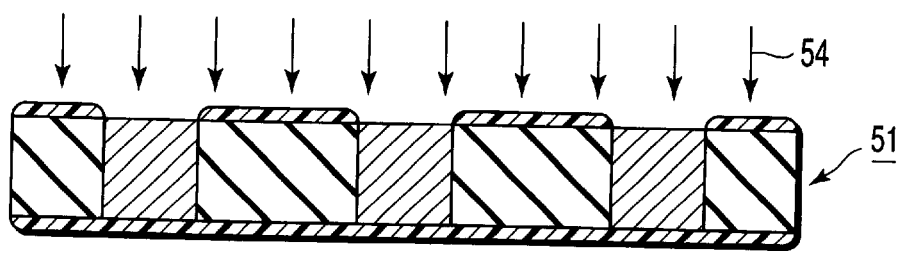
F I G. 10C
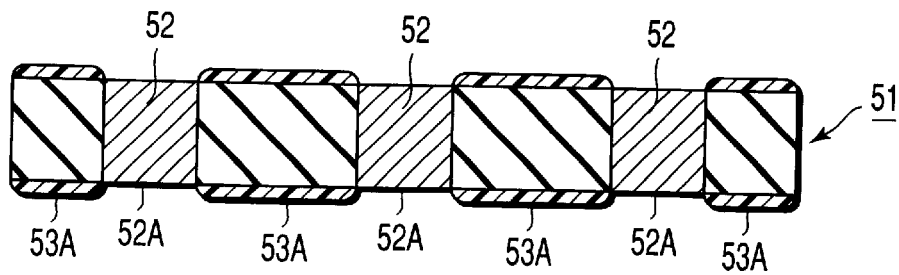
F I G. 10D

METHOD FOR MANUFACTURING A COMPOSITE MEMBER FROM A POROUS SUBSTRATE BY SELECTIVELY INFILTRATING CONDUCTIVE MATERIAL INTO THE SUBSTRATE TO FORM VIA AND WIRING REGIONS

CROSS-REFERENCE TO RELATED APPLICATIONS

This application is based upon and claims the benefit of priority from the prior Japanese Patent Applications No. 2001-170018, filed Jun. 5, 2001; and No. 2001-295461, filed Sep. 27, 2001, the entire contents of both of which are incorporated herein by reference.

BACKGROUND OF THE INVENTION

1. Field of the Invention

This invention relates to a method for manufacturing a composite member comprising an insulating body which is provided with a conductive region such as a wiring, the composite member being designed to be employed as a wiring board in various technical fields such as electrics, electronics and telecommunications.

2. Description of the Related Art

In recent years, there has been a prominent advance with regard to the integration and miniaturization of various kinds of electric and electronic parts including semiconductor devices. It is certain that this trend will further advance. Concomitant with this trend, it has been tried to make a metallic wiring finer in pattern and in pitch as well as to make a metallic wiring sterically (three-dimensionally), thereby making it also possible to realize a high-density packaging in a printed wiring board.

Among them, the three-dimensional metallic wiring is indispensable to realize high-density packaging, and therefore, there have been proposed various methods for the manufacture of a wiring board provided with a three-dimensional wiring.

According to the conventional method of manufacturing a wiring board however, it is very difficult to easily prepare a fine wiring structure which is three-dimensionally free in configuration.

In the formation of a three-dimensional wiring in a wiring board, a plurality of two-dimensional wiring boards are laminated to form a multi-layered wiring board structure as represented by a build-up wiring board for example. According to this multi-layered wiring board structure, a wiring layer is electrically connected through a conductive column of a so-called "via" with a neighboring wiring layer which is disposed thereupon or thereunder.

The via to be employed in this manner has been conventionally formed by the following procedures. First of all, by a photolithography step employing a photo-sensitive polyimide or resist, a through-hole (via-hole) is formed in an insulating body. Then, the through-hole is selectively plated or filled with a conductive paste to form the via. If the via is to be formed in this manner, various steps such as the coating of a resist to form a resist film, the exposure of the resist film, and the etching of the resist film are required. Therefore, the formation of a via is not only very troublesome but also very difficult in improving the yield thereof.

As another example of the method of forming the via, there is known a method wherein a via-hole having a predetermined size is formed in an insulating body by using a drill or a $CO_2$ laser, and then, a plating is applied to the via-hole or the via-hole is filled with a conductive paste to form the via.

However, it is difficult, according to the aforementioned method wherein a hole is formed in an insulating body, to form a fine via having a diameter of not more than several tens of microns at any desired region of the insulating body.

Japanese Patent Unexamined Publication (Kokai) H7-207450 discloses a method wherein a three-dimensional porous film made of PTFE is at first impregnated, through the pores thereof, with a compound having a hydrophilic group, and then, the resultant porous film is subjected to a patterning exposure by using a low pressure mercury lamp (wavelength: 185 nm and 254 nm) to form a pattern of the hydrophilic group on the three-dimensional porous film, to which a metallic plating is subsequently applied.

However, the method proposed by this Japanese Patent Publication is accompanied with various problems that the three-dimensional porous film material is caused to degrade due to the exposure using light having short wavelength, that the exposure beam is incapable of penetrating into the interior of the porous body as it is absorbed by the three-dimensional porous film to make it impossible to form a fine via, and that since most of the compounds to be impregnated into the three-dimensional porous film are liquid, measurements to cope with the spilling of liquid are required to be taken on the occasion of the exposure process.

Japanese Patent Unexamined Publication (Kokai) H10-149722 discloses another method of forming the via. According to this method, a photosensitive composition containing a photo-sensitive reducer and a metal salt is at first impregnated into the entire surface of a porous insulating body, the resultant porous insulating body is then subjected to a patterning exposure to reduce the cation of the metal salt of the exposure region into a metal nucleus, and after the photo-sensitive reducer existing in the unexposure region has been completely washed out, a electroless plating is applied to the residual metal nucleus to form a via of a desired pattern.

However, the method proposed by this Japanese Patent Publication is accompanied with various problems that since a photosensitive composition containing a metal salt is enabled to impregnate the entire surface of a porous insulating body, it is difficult to completely remove, subsequent to the exposure process, the metal salt that has been adsorbed onto the nonexposure region, thereby permitting the generation of a phenomenon of precipitating the metal nucleus at an undesired region in the subsequent reducing process, that due to this abnormal precipitation of the metal nucleus, the insulation property between neighboring vias or between neighboring wiring layers would be deteriorated as the pattern becomes increasingly finer, and that since the exposure light is absorbed by the metal salt or the metal nucleus that has been generated, it is impossible to enable the interior of the porous body to be sufficiently exposed to the exposure light.

Moreover, according to the aforementioned conventional manufacturing method of a wiring board, a wiring is formed subsequent to the formation of the via on an insulating substrate, thereby raising a problem that it is difficult to secure a sufficient contact between the via and the wiring, and hence to ensure an electric contact between them. Additionally, a misalignment may be caused to generate between the via and the wiring due to the expansion or contraction of the insulating substrate on the occasion when the wiring is to be formed on the insulating substrate after finishing the provision of the via. Therefore, it is necessary, in order to absorb this misalignment, to provide the wiring with a via-receiving portion called a "land". Generally, since the diameter of the land is 2 to 3 times higher than the diameter of the via and since the wiring is required to be formed while keeping it away from this large land, it is difficult to enhance the density of wiring. Further, since the wiring is formed on the surface of the insulating substrate, the adhesivity between the wiring and the insulating substrate is relatively poor, thus raising a problem that a conductive portion may peel away from the insulating substrate on the occasion of mounting electronic parts thereon or in the use of electronic parts.

With a view to solve the aforementioned problems, the present inventors have proposed in Japanese Patent Application 2000-159163 a method wherein a substrate made of a porous insulating body and covered on the inner surface thereof with a photosensitive composition layer containing naphthoquinone diazide as a photo-sensitizer is subjected to a patterning exposure by using ultraviolet rays, thereby making it possible to form a conductive portion in the interior of a porous body. According to this method, since the interior of the porous body is enabled to be sufficiently exposed to ultraviolet rays, it becomes possible to form a fine via and a fine wiring.

With a view to enhance the photo-sensitivity so as to enable the exposure to be performed by using even visible light, it is also proposed by the present inventors in Japanese Patent Application 2001-093668 a method of forming a conductive pattern by chemical amplification and a material to be employed in the method.

Even in either of the aforementioned methods, the via constituting a through-hole portion of the wiring board is formed by a step which is performed separate from the step for forming a wiring portion to be disposed on only one surface of the wiring board. Therefore, if it is possible to concurrently form not only the via but also the wiring through a single process, it would become possible not only to reduce the manufacturing cost but also to obviate the measures for the alignment between the via and the wiring, thus offering a lot of merits.

BRIEF SUMMARY OF THE INVENTION

Therefore, an object of the present invention is to provide a method for manufacturing a composite member comprising a substrate formed of a porous insulating body, wherein a via constituting a through-hole portion and a wiring formed on at least one surface of the substrate are enabled to be concurrently formed in a single process, thereby enhancing the freedom in designing a conductive circuit.

According to one aspect of the present invention, there is provided a method for manufacturing a composite member comprising a porous substrate, an interfacial conductive portion where a conductive material is filled piercing through the entire thickness of the porous substrate, and a non-interfacial conductive portion where a conductive material is filled but not piercing the entire thickness of the porous substrate; the method comprising:

exposing a first region and a second region in the porous substrate using an exposure beam, the amount of exposure to the second region being not more than 50% of the amount of exposure to the first region, and an average size of voids of the porous substrate being, as expressed by a radius of gyration, $1/20$ to 10 times the wavelength of the exposure beam;

forming the interfacial conductive portion and non-interfacial conductive portion by infiltrating a conductive material into the first region and the second region respectively.

According to another aspect of the present invention, there is provided a method for manufacturing a composite member comprising a porous substrate, non-interfacial conductive portions which are formed on the opposite surfaces of the porous substrate and where a conductive material is filled but not piercing the entire thickness of the porous substrate, and an interfacial conductive portion which is electrically connected with the non-interfacial conductive portions and where a conductive material is filled piercing through the entire thickness of the porous substrate; the method comprising:

disposing a couple of masks on the opposite surfaces of the porous substrate, respectively, the masks comprising a first light-transmitting region for exposing a first region of the porous substrate and a second light-transmitting region for exposing a second region on the opposite surfaces of the porous substrate, the second light-transmitting region comprising an aggregation of fine patterns, an average transmittance of the second light-transmitting region being not more than 50% of an average transmittance of the first light-transmitting region., and the each of masks aligned based on the position of the first light-transmitting region of each of the masks;

exposing the first region and the second region to a exposure beam through each of the masks, an average size of voids of the porous substrate being, as expressed by a radius of gyration, $1/20$ to 10 times the wavelength of the exposure beam;

forming the interfacial conductive portion and non-interfacial conductive portion by infiltrating a conductive material into the first region and the second region respectively.

BRIEF DESCRIPTION OF THE SEVERAL VIEWS OF THE DRAWING

FIGS. 10A to 10D respectively shows a cross-sectional view illustrating the method for manufacturing a composite member according to a further embodiment of the present invention.

DETAILED DESCRIPTION OF THE INVENTION

Figure 1:
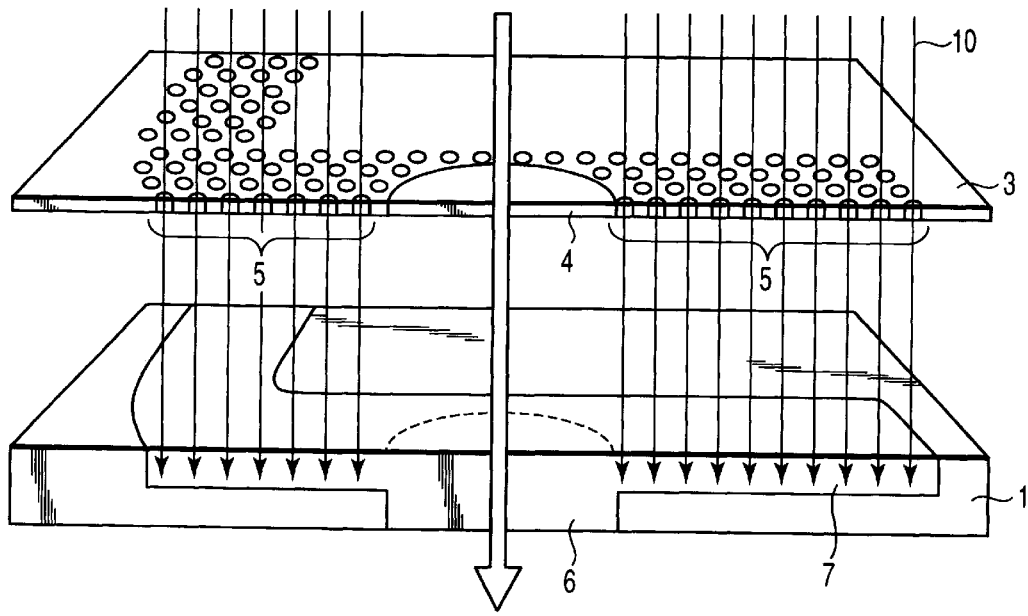
FIG. 1 shows a partially sectioned view schematically illustrating the manufacturing method of a composite member according to one embodiment of the present invention.

Next, various embodiments of the present invention will be explained in details.

The present inventors have made intensive studies on the method for manufacturing a composite member provided with a conductive portion, the method being characterized in that a porous substrate made of an insulating material is selectively irradiated with a beam, and then, a conductive material, in particular, a metallic material is introduced into the irradiated portions to form a conductive portion comprising a wiring pattern and a via. As a result, the following facts have been found out by the present inventors. Namely, it has been found possible, by positively making the most of the light scattering phenomenon in the interior of the porous substrate on the occasion of irradiating the porous substrate with beam, to concurrently form a region for forming the conductive portion, thus necessitating only a single exposure process, this region being subsequently filled with a conductive material in a subsequent step. As a result, it has been found possible to manufacture a composite member comprising an interfacial conductive portion (a via) where a conductive material is filled piercing through the entire thickness of the porous substrate, and a non-interfacial conductive portion (a wiring) where a conductive material is filled but not piercing the entire thickness of the porous substrate by a simple, easy and low cost process.

First of all, the concept of the embodiments of the present invention will be explained. As one example, a method of forming the wiring concurrently with the via in a double wiring substrate where a metal wiring is formed on the opposite surfaces of a sheet-like porous insulating body and a metal via is formed piercing through the entire thickness of the insulating body will be explained below. This example is simplified for the convenience of easily understanding the present invention, and hence this example should not be taken as limiting the embodiments of the present invention.

In one embodiment of the present invention, a conductive portion is formed on the surface and in the interior of a porous substrate having a thickness in the order of nanometers or micrometers. More specifically, a porous substrate having a coated layer of photo-sensitizer in the interior thereof or on the surfaces thereof is irradiated in a pattern with an ultraviolet beam or a visible beam so as to sensitize the coated layer to enabling an ion-exchange group to generate at the photosensitized portion of the coated layer. Then, after allowing a metal ion to be adsorbed onto the ion-exchange group, the metal ion is reduced to precipitate fine metal particles. Further, if required, a metal plating is applied to a layer of the fine metal particles to form the conductive portion.

The conductive portion thus formed is constituted by a non-interfacial conductive portion (a wiring portion) where the conductive material is not filled piercing the entire thickness of the porous substrate, and an interfacial conductive portion (a via portion) where the conductive material is filled piercing through the entire thickness of the porous substrate. According to the conventional method, the wiring portion is formed by a separate step from the step of forming the via portion. Whereas, according to the above embodiment of the present invention, a porous substrate is employed, and the patterning exposure to the substrate is performed through a mask adapted for specific exposure, thereby making it possible to concurrently form the wiring portion and the via portion.

Generally, when a beam is irradiated to a porous substrate for carrying out the patterning exposure thereof, it is imperative for the beam to repeatedly pass through a couple of spaces, i.e. a void portion and a material portion, which differ in refractive index from each other. In this case, the refractive index of the void portion is 1 which is almost the same as that of vacuum. Whereas if the base material portion is constituted by a polymer for instance, the refractive index of the material portion is 1.4 or more. Therefore, the beam would scatter considerably. In particular, when the size of the void or the base material portion of the porous substrate is close to the wavelength of the beam, the irradiated beam would be greatly scattered. Furthermore, when the substrate is formed of a porous body, the beam once scattered is again caused to impinge upon a scattered beam repeatedly, thereby generating a multiple scattering. This embodiment according to the present invention positively makes the most of this feature of the porous body.

FIG. 1 schematically illustrates the concept of the manufacturing method of a composite member according to one embodiment of the present invention.

As shown in FIG. 1, an exposure light 10 is irradiated to a porous substrate 1 through a mask 3 having a prescribed light-transmitting region. Specifically, the mask 3 employed in one embodiment of the present invention is provided with two kinds of light transmitting regions, i.e. a region 4 which is completely vacant, and a region 5 which is constituted by an aggregation of fine patterns such as very fine dots.

When the exposure beam 10 is irradiated on the porous substrate 1 through such a mask 3, the beam introduced into the porous substrate 1 through the light transmitting region 4 having a large vacant portion is caused to scatter in the interior of the porous substrate 1. As a result, only 1% of the beam that passes straight through the entire thickness of the porous substrate 1, reaches the underside surface of the porous substrate 1, i.e. this amount is almost negligible. However, as long as the base material itself is incapable of absorbing light, it is possible to secure a fairly large quantity of light even at the underside surface of the porous substrate 1. This fact can be explained by the following mechanism.

Figure 2A:
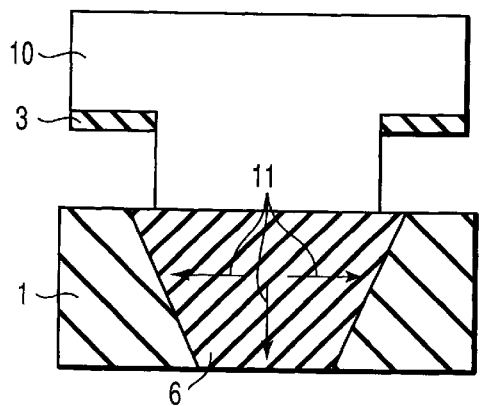
FIGS. 2A and 2B respectively shows a cross-sectional view illustrating the method for manufacturing a composite member according to another embodiment of the present invention.
Figure 2B:
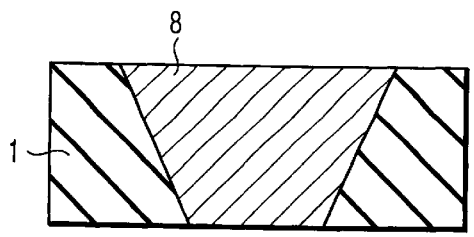

When a beam irradiated is impinged against a porous body functioning as a scatterer, the beam is caused to refract, so that the probability of generating scattering can be determined by the refractive index of the scatterer. Due to the repeated scattering of beam as the beam has passed through a number of scatterers, there is a low probability of finding a beam which has been rectilinearly propagated. However, if the absorption coefficient of the scatterer is minimal, the energy of the beam can be preserved in the form of a scattered beam. Namely, the beam is allowed to exist inside the scatterer as a beam having a different direction of propagation. More specifically, as shown in FIG. 2A, it is considered that the exposure beam 10 that has passed through a large vacant region of the mask 3 would be repeatedly scattered as it passes through the interior of the porous substrate 1, thus turning it into a scattered beam 11 which is enabled, while changing the direction of propagation thereof, to reach the bottom surface of the porous substrate 1 which is located opposite the light source. It is possible, in this manner, to sensitize the via-forming region 6 of the porous substrate 1 throughout the entire thickness of the porous substrate 1 as shown in FIG. 2A or FIG. 1. Then, a metal plating is applied to this photo-sensitized region 6 to fill the region 6 with a conductive material to form a via 8 penetrating the entire thickness of the porous substrate 1 as shown FIG. 2B.

When any optional inner point in the porous body is taken as an example, although there is a small possibility that the point can be directly irradiated by a beam that has passed through a mask, the point can be supplementally irradiated by scattered beams. Therefore, some degree of light volume can be secured for the point. As a matter of fact, when a PTFE porous body 0.2 $\mu$m in average aperture diameter, 79% in aperture ratio, and 20 $\mu$m in thickness was irradiated with a beam, it was confirmed that about 50% of the beam was able to reach the bottom surface of the porous body due to a multiple scattering of the beam even though the beam which was able to pass straight through the entire thickness of the porous body was scarcely recognized.

Figure 3A:
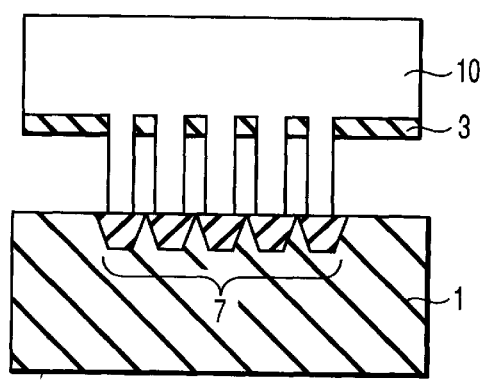
FIGS. 3A and 3B respectively shows a cross-sectional view illustrating the method for manufacturing a composite member according to a further embodiment of the present invention.
Figure 3B:
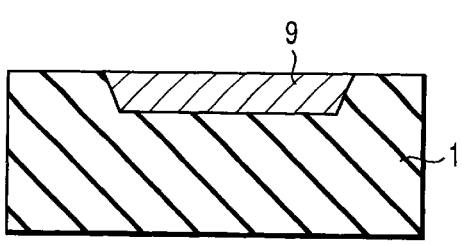

By contrast, the beam that has been irradiated onto the porous substrate 1 through a region 5 which is constituted by very fine dots is incapable of reaching the bottom surface of the porous substrate 1 due to the scattering thereof. In the case of the large vacant region however, a plurality of beams neighboring to each other are caused to scatter in the same manner, thereby supplementing the light volume, thereby allowing the scattered beams to penetrate down to the bottom surface of the porous substrate 1 to sensitize the region. On the other hand, in the case of the very fine dots, it is impossible to supplement the light volume, so that the beam irradiated onto the porous substrate 1 is capable of sensitizing only the surface region of the porous substrate 1. However, since the scattered beam is enabled to diffuse laterally, the surface of the porous substrate 1 is exposed or sensitized larger than the actual size of the dots formed in the mask as shown in FIG. 3A. As a result, a wiring-forming region 7 as shown in FIG. 3A or FIG. 1 can be sensitized only at the surface layer of the porous substrate 1 without being sensitized throughout the entire thickness of the porous substrate 1. Then, a metal plating is applied to this wiring-forming region 7 to fill the region 7 with a conductive material such as a metal to form a wiring 9 as shown FIG. 3B.

The porous substrate employed for forming a conductive portion by the aforementioned method should preferably be made of an insulating body if a wiring board is manufactured. Further, this porous substrate may be formed of a porous polymer compound, an inorganic material such as glass fiber, or a combination of these materials. The composite member, which can be manufactured through a process wherein the aforementioned porous substrate is subjected to an exposure step, and the resultant exposure portion is filled with a conductive material such as a metal to form a conductive portion comprising wirings and vias, can be employed as a base material for a printed wiring board.

The porous substrate employed in this case is required to have a large number of voids. Moreover, the voids in the porous substrate are required communicated with each other so as to enable the top surface of the substrate communicated with the bottom surface thereof through the filling of a conductive material in a subsequent step.

One embodiment of the present invention, the embodiment is characterized in that a porous body exhibiting a very strong scattering property is employed.

Since the beam introduced perpendicularly into a porous substrate is caused to bend in the propagation direction due to the scattering thereof, the beam is caused to attenuate gradually. The attenuation ratio of light where a rectilinearly propagating beam is employed varies greatly depending on whether the light source is a point light source or surface light source. When the light source is a point light source, the beam is permitted to diffuse without being compensated. Therefore, the beam is allowed to attenuate rapidly. Whereas when the light source is a surface light source, the beam that has been lost due to the scattering thereof can be supplemented by neighboring portion. Therefore, the attenuation ratio can be minimized. When the attenuation ratio of the point light source is represented by "a", and the attenuation ratio of the surface light source is represented by "b", the relationship between "a" and "b" can be always expressed by the following formula:

$$a>b$$

Whereas, when the beam is attenuated due to the absorption of light for example, and if it is assumed that there is no scattering, the relationship between "a" and "b" can be expressed by the following formula:

$$a=b$$

Since the region of the via is irradiated in such a manner that an area of the via region which is much greater than the wavelength is irradiated en bloc, the region of the via can be assumed as being a surface light source. Therefore, the attenuation of incident light at the via region can be expressed by the following formula wherein the incident light volume is represented by I(0), and the light volume at the position "z" is represented by I(z), I(z) can be expressed by the following formula:

$$I(z)=I(0) \exp(-bz)$$

Due to the enhancement in densification of a wiring board, the fineness of the wiring pattern has been greatly promoted. Therefore, the wiring pattern may be assumed as being close to the aforementioned point light source. In particular, in a case where an exposure process is performed by using a fine pattern according to one embodiment of the present invention, the fineness of the fine pattern is very close to the wavelength of the beam, it may be considered as being a point light source. On this occasion, the attenuation ratio of the beam in the vicinity of the surface of the exposed surface can be considered as being "a".

However, as the beam is increasingly diffused, the beam is homogenized in the z-plane, thereby rendering the beam to become close to a surface light source. Therefore, the changes of light volume in the direction of z-axis can be represented by the following formula:

$$I(z)=I(0)\{j \exp(-az)+k \exp(-bz)\}$$

wherein j+k=1

What should note in this case is that since a>b, the value of I(z) is rapidly minimized in proportion with "a" at a region where the value of "z" is small, whereas when the value of "z" is increased, the attenuation ratio of the beam decreases in proportion with "b".

As seen from this formula mentioned above, according to one embodiment of the present invention, as far as the wiring portion to be formed in the second light-transmitting region is concerned, the region close to the surface thereof (surface region) is most strongly irradiated with the beam, thereafter the light intensity of the beam is gradually attenuated. Incidentally, the beam thus dissipated at the surface region is caused to diffuse in the lateral direction. As a result, the beam thus diffused laterally is enabled to be utilized for photo-sensitizing the other regions in the surface region, and therefore, the beam thus diffused is suited for use in forming a region for forming a surface wiring.

By contrast, when the beam is allowed to attenuate only due to the absorption thereof without being allowed to scatter, the relationship between "a" and "b" becomes a=b, and hence the changes of light volume in the direction of the z-axis can be represented by the following formula:

$$I(z)=I(0)\{j\exp(-az)+k\exp(-bz)\}=I(0)\exp(-bz)$$

In this case, there is little possibility that only the surface region is strongly irradiated.

As explained above, it is possible, by using a porous body, to allow a conductive material to enter into the interior of the porous body at the region for forming the via, and at the same time, to allow a conductive material to enter into only the surface layer of the porous body at the region for forming the wiring.

According to one embodiment of the present invention, the size of voids in the porous substrate can be defined by a radius of gyration. This radius of gyration is a radius which is weighed with a moment. As a result, as long as this radius of gyration is the same, the scattering property of the beam would become the same even if the configurations of voids vary from each other.

Next, the procedures for experimentally determining the radius of gyration of voids in a porous substrate will be explained as follows.

First of all, a porous substrate is cut out to prepare a sample having such a small thickness which is effective in reducing a multiple scattering as little as possible. Alternatively, the voids of a porous substrate are filled with a substance having a refractive index which is close to the base material of the substrate, thereby inhibiting the scattering property of the substrate. To the samples thus obtained, a point light source excellent in linear propagation such as laser beam is irradiated, and the generated scattering light was measured by using a photodiode array or a CCD. Further, the angle-dependency θ of the scattered beam is detected, and "q" is determined by the following formula (1).

$$q=(4\pi/\lambda)\sin(0.5\theta) \quad (1)$$

The "q" to be determined by this formula corresponds to a scalar value of the scattering vector.

Finally, the logarithm of scattering intensity (I(q)) is plotted relative to a square of "q" ($q^2$). This plot is called a Guinier Plot, and the radius of gyration can be determined by doubling the square root of the inclination of this plot.

Figure 4:
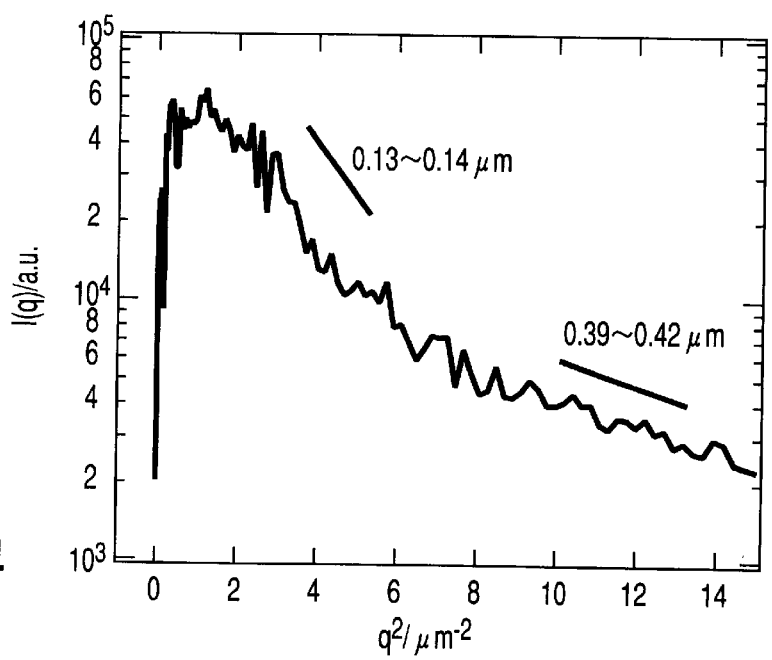
FIG. 4 shows a graph showing Guinier plots which were obtained as HeNe laser is irradiated onto a PTFE porous film.

FIG. 4 shows one example of the Guinier Plot which was obtained when a PTFE porous film is irradiated with HeNe laser. This base material was actually employed as an example. The radius of gyration of the base material portion of the PTFE porous film that was determined from the aforementioned inclination was in the range of 0.12 to 0.13 μm, and the radius of gyration of the void portion of the PTFE porous film was in the range of 0.39 to 0.42 μm. Incidentally, the radius of gyration according to one embodiment of the present invention means an average of the radii of gyration, and this average radius of gyration can be determined by a light scattering method.

It is possible, by using the aforementioned method, to experimentally determine an accurate radius of gyration. As a matter of fact, when the voids of a porous body are constituted by an aggregation of a large number of tunnels or holes, there is little possibility that the radius of the tunnels or the holes differ from each other by one magnitude. Incidentally, when the tunnel or the hole is formed of a spherical configuration having a radius R, the radius of gyration thereof can be represented by the following formula (2):

$$Rg=\sqrt{(3/5)}R \quad (2)$$

Whereas, when the tunnel or the hole is formed of a rod-like configuration having a length L and a radius R, the radius of gyration thereof can be represented by the following formula (3):

$$Rg=\sqrt{(R^2/2+L^2/3)} \quad (3)$$

According to one embodiment of the present invention, the phenomenon that the beam irradiated to a porous body is forced to scatter in the interior of the porous body is utilized. Therefore, an optimum magnitude of voids in the porous body is determined by defining the radius of gyration as explained above.

When the scatterer is only one, the relationships among the attenuation ratio σ indicating the scattering property thereof, the wavelength λ of the beam, the volume V of the scatterer, and the radius of gyration Rg can be represented by the following formula (4):

$$\sigma \propto V^2/\lambda^{-4}=Rg^6/\lambda^{-4} \quad (4)$$

In a case where a large number of voids exist at the same density throughout the porous body, the attenuation ratio can be calculated based on a unit volume. Thus, the attenuation ratio a can be represented by the following formula (5):

$$\sigma \propto Rg^2/\lambda^{-4} \quad (5)$$

Therefore, in the case of the porous body employed in one embodiment of the present invention, the scattering property would be increased at the ratio of the square of the radius of gyration Rg.

According to this formula (5), when Rg becomes about 20 nm, the scattering property σ per 1 μm would become about $5\times10^{-4}$. In this case, the scattering in a porous body having a thickness of 100 μm would become about 5%. According to the method of one embodiment of the present invention, a conductive material is buried in a step subsequent to the exposure process. Assuming that the upper limit in thickness of the porous substrate is about 500 μm, the lower limit of the radius of gyration of the voids is assumed to be 1/20 of the wavelength of the exposure beam.

When the scatterer becomes smaller, the scattering property of the beam would be sharply decreased in proportion to the square of the volume of the scatterer because of the correlation between the wavelength of the beam and the volume of the scatterer. The deterioration of the scattering property of the porous body should be prevented as much as possible in one embodiment of the present invention.

Therefore, the lower limit of the radius of gyration of voids in the porous substrate to be employed in one embodiment of the present invention should be confined to 1/20 of the wavelength of the beam to be irradiated in an exposure process. If the radius of gyration is smaller than this lower limit, the scattering of the beam would scarcely take place. Since the radius of gyration of the voids which actually enables the scattering of the beam to be prominently increased is not less than 1/4 of the wavelength of the beam, the radius of gyration of the voids should preferably be not less than ¼ the wavelength of the beam to be irradiated the exposure process. Further, when ultraviolet rays or visible light is employed as an exposure beam, it would become difficult to fill the voids with metal plating if the radius of gyration of the voids is too small relative to the wavelength of the beam.

On the other hand, if the voids are too large relative to the wavelength of beam, it may become impossible to sufficiently scatter the beam inside a porous body. Therefore, the radius of gyration of the voids should preferably be confined to not more than 10 times the wavelength of the beam to be irradiated on the occasion of exposure process. Since the wavelength of the exposure beam is about 200 to 700 nm, the radius of gyration of the voids should preferably be confined to not more than four times the wavelength of the exposure beam in order to manufacture a porous substrate provided with a conductive portion such as a fine wiring or a fine via of the order of micrometers in fineness.

A porous substrate having such fine voids is then coated or impregnated with a photo-sensitizer prior to the exposure process thereof. As for the photo-sensitizer, any kind of compound can be employed as long as the compound is capable of generating an ion-exchange group by beam exposure. In this case, since the protective group protecting the ion-exchange group is hydrophobic, it is impossible to enable the ion-exchange group to generate in a sufficient quantity if the exposure dose is insufficient, thereby rendering such an insufficiently irradiated region to exhibit a strong hydrophobicity as a whole. Therefore, it is impossible for a metallic ion to approach this region in the metal ion-exchanging reaction to be executed successively. Since a metal ion or the reduced material thereof functions as a catalyst in a electroless plating, it is quite impossible to enable the metal to precipitate in an insufficiently irradiated region even if a electroless plating is applied to the region.

For instance, when it is desired to irradiate a porous substrate having such a photo-sensitizer impregnated therein with a beam at a different exposure dose depending on a particular region of the substrate, the exposure region of a mask may be partially covered with an optical filter so as to partially attenuate the irradiating beam. In this case, at an exposure portion of the porous substrate where the beam is irradiated without being attenuated, the ion-exchange group is permitted to generate sufficiently to weaken the hydrophobicity of the irradiated region as a whole. In the region having the hydrophobicity thereof weakened in this manner, a conductive pattern penetrating throughout the entire thickness of the substrate (i.e. the top surface of the substrate is permitted to communicate with the bottom surface thereof) can be formed. On the other hand, with regard to an exposure portion of the porous substrate which is irradiated with an attenuated beam, since the hydrophobicity of the irradiated region is strong as a whole because of the reason as explained above, a conductor pattern is permitted to selectively precipitate only at the irradiated surface region of the porous substrate. As a result, it is now possible to concurrently form a via pattern and a wiring pattern in a single exposure process. This method illustrates the manufacturing method of the composite member according to one embodiment of the present invention.

However, in actually, the aforementioned attenuation of beam cannot be performed so easily. For instance, in a situation when a chromium mask is employed, it is rather difficult to attenuate the beam by the shading of the mask. Moreover, such a shaded mask (half-tone mask) is expensive. Further, when the region for the via and the region for the surface wiring are formed in a base material by using only the shading of the exposure beam, a conductive material which is formed due to the bleeding in a depth-wise direction of the surface wiring region would be quite frequently precipitated subsequent to the step of filling the surface wiring region with a conductive material. As a result, it may become difficult to insulate between the top surface wiring and the bottom surface wiring of the substrate.

As for the method of changing the exposure dose, there are various exposure methods where a mask is not employed, other than the method using a mask. For example, if the scanning of an energy beam such as laser beam is to be employed for the exposure, it is possible to change the exposure dose by modulating the intensity of the laser beam. Alternatively, if a patterning exposure is to be performed by using a laser diode array, it is possible to change the exposure dose by modulating the intensity of the outgoing beam of the individual laser source. Further, it is possible to change the exposure dose by modulating the beam from a light source by using a micro-mirror array. This micro-mirror array is a kind of light-modulating apparatus wherein a large number of micro-mirrors are arrayed in a matrix pattern. Specifically, tens of thousands to millions or more of square micro-mirrors each 5×5 µm to 20×20 µm in size for instance are arrayed in a matrix pattern. In this case, an individual micro-mirror is enabled to independently modulate the angle thereof, so that the angle of reflection of the exposure beam that has been emitted from a light source can be individually altered. Therefore, each of the mirrors constitutes one pixel, so that the angle of each individual mirror can be modulated in accordance with the patterns of the wiring or via to be exposed to the beam, thereby making it possible to form an exposure pattern.

It is possible to employ, as one example of such a micro-mirror array, a digital micro-mirror device (Texas Instruments, Inc., Dallas, Tex., USA). When it is desired to change the exposure dose, the configuration of the exposure pattern is changed during the exposure process by using a micro-mirror array. For example, first of all, the exposure is executed by using an exposure pattern comprising that of a via portion as well as that of a wiring portion, and after a predetermined time, the exposure is executed by using an exposure pattern comprising only that of a via portion. As a result, it becomes possible to easily make the exposure dose of the via portion larger than that of the wiring portion. Since the switchover of the configuration of the exposure pattern can be performed at a high speed, the misalignment between the via and the wiring can be substantially prevented. The switchover of the configuration of the exposure pattern is not limited, but can be repeated at any desired time. For example, the irradiation of the wiring pattern and of the via pattern may be alternately performed at short time intervals. In this case, the ratio of the total time of irradiation between these patterns should be set so as to make the ratio of exposure dose become a predetermined ratio as desired. When the exposure is performed in this manner, the exposure for the via pattern as well as for the wiring pattern can be finished simultaneously, thereby making it possible to further minimize the misalignment, if any, between the via and the wiring.

The exposure pattern may be changed at any time during the exposure process, not only for the preparation of the via portion and the wiring portion, but also for delicately adjusting the exposure dose in conformity with the configuration of the patterns. For example, when it is desired to fabricate a couple of wiring patterns on the top and bottom surfaces of a single porous sheet, respectively, a portion where one wiring pattern passes over the other wiring pattern is more likely to be excessively exposed. Further, a region lying between a couple of closely disposed patterns is also more likely to be excessively exposed, i.e. the effects due to the proximity of exposure patterns on the exposure dose. Even in such cases, it is possible, by using the micro-mirror array, to easily reduce the exposure dose at the passover portion of wiring patterns for instance.

In addition to the micro-mirror array, there are also known various kinds of light-modulating apparatuses such as a light-modulating apparatus utilizing a liquid crystal, which makes it possible to perform a mask-less exposure in the same manner as mentioned above.

It has been found by the present inventors, as the nature of the scattering of the beam inside the porous substrate as well as the growth process of a conductive material such as metal on the occasion of electroless plating are taken into consideration, that the employment of the mask which is designed as follows is very effective.

Namely, with respect to the beam-transmitting region of a mask for forming a perforated via-forming region (interfacial conductive portion-forming region) in the substrate, an ordinary vacant mask is employed. On the other hand, with respect to the beam-transmitting region of a mask for forming a non-perforated wiring-forming region (non-interfacial conductive portion-forming region) at the surface layer of the substrate, it may be constituted by a plurality of fine patterns, i.e. fine holes or fine regions enabling the beam to pass therethrough. The size of the fine pattern should preferably be within the range of 0.1 $\mu$m to 10 $\mu$m.

The merit that can be obtained when a plated pattern is formed in a porous substrate by using a mask provided with these two kinds of beam-transmitting regions is remarkable, as explained below.

Electroless plating fundamentally arose from a nucleation and growth process. Namely, in another embodiment of the present invention, a metal is precipitated not uniformly in the exposure portion of the substrate which has been irradiated through a mask, but a nucleus of the metal is allowed to generate at specific portions of the exposure portion. Then, the metal is allowed to grow from this nucleus as a start point.

If it is assumed that the metal precipitates uniformly, the free energy of the mixture is negative in a single differentiation as well as in a double differentiation in the thermodynamic viewpoint. However, the growth is based on the nucleation and growth process, the single differentiation is positive, and only the double differentiation is negative, thus distinguishing it from the former phenomenon. Namely, there is a potential barrier that should be overcome if a metal is allowed to grow. The metal is allowed to grow only when the metal is able to stochastically overcome the barrier by the effect of the fluctuation that would be generated according to Boltzmann distribution. Therefore, if the growth of metal is adjusted only through the adjustment of the exposure dose, a non-uniform growth of metal will be resulted even if the exposure dose is the same.

It has been found out by the present inventors that in order to overcome this problem, it is effective only a minute portion of the surface of porous substrate is strongly irradiated, so as to bring this portion into a condition where the metal can be very easily precipitated. When the nucleus generation and growth of metal are permitted to take place using this portion as a start point, a metal plating can be stably precipitated, from a thermodynamic viewpoint. As a result, the metal is allowed to precipitate predominantly only at the surface region of the porous substrate, thereby making it possible to form a wiring portion. The method for manufacturing a composite member according to another embodiment of the present invention is based on such a procedure as mentioned above.

Since a porous body exhibiting a very strong scattering property is employed even in the manufacturing method of any of the aforementioned composite members, the exposure beam is caused to scatter and attenuate in the substrate. Therefore, the intensity of exposure is required to be greater than the case where a transparent substrate is employed. The attenuation of the beam inside a scatterer can be represented by the following formula:

$$E(D)=E(0) \exp(-D/\tau) \tag{6}$$

wherein $E(D)$ is a quantity of beam at a depth D of the porous substrate; $\tau$ is a depth where the beam becomes 1/e; and $E(0)$ is the intensity of the exposure beam at the irradiated surface of the porous substrate.

In this case, the minimum quantity of the beam for providing the conductive material with a sufficient conductivity is defined as $E_{th}$.

It is required that a sufficient quantity of the beam is capable of reaching the bottom surface of the porous substrate at the portions of the porous substrate where interfacial vias are to be formed. For this purpose, in the case of the substrate having a thickness R, $E_1(0)$ is required to be set so as to secure a sufficient quantity of the beam at the location $E_1(R)$. Specifically, the beam-transmitting ratio of this portion should preferably be at least 90%. The higher this value is, the more it is preferable, so that this value should most preferably be at least 99%.

The $E_1(0)$ demanded in this case can be represented by the following formula (7).

$$E_1(0) \geq E_{th}/\exp(-R/\tau) \tag{7}$$

The substrate to be employed in another embodiment of the present invention is a porous substrate, and hence the ratio of the beam (including scattered beam) that can reach the bottom surface of the substrate is about 10 to 70%. Since a multiple scattering is utilized in another embodiment of the present invention, if this value of the substrate is higher than 70%, it would be impossible to expect a sufficient degree of multiple scattering. On the other hand, if this value of the substrate is lower than 10%, it would be impossible to form an interfacial via due to the multiple scattering even if the quantity of the beam is increased furthermore.

In the meantime, as far as the regions where a wiring is to be formed, it is preferable that the substrate is provided with an increasingly densified conductive layer at a shallower portion of the substrate starting from the exposure surface of the substrate. If the quantity of the beam is secured sufficient for enabling it to reach the bottom surface of the substrate at the via-forming regions, the quantity of the beam at the exposure surface of the wiring-forming regions is required to be reduced to a fairly large extent. When the transmittance or aperture ratio of the second beam-transmitting region relative to the first beam-transmitting region is represented by $\alpha$, the exposure dose $E_2(0)$ for forming the wiring can be represented by the following formula (8).

$$E_2(0)=\alpha E_1(0) \tag{8}$$

In order to concurrently form the interfacial vias and the wirings disposed only at the exposure surface under the aforementioned conditions, the value of α should preferably be confined by the following formula (9).

$$\alpha \leq \exp(-R/\tau) \tag{9}$$

In view of this condition, it is desired to limit the quantity of the beam at the second beam-transmitting region to less than 50% relative to that at the first beam-transmitting region in order to secure a sufficient exposure dose at the via-forming regions of the bottom surface and at the same time, to enable only the wiring-forming regions of the top surface portion to be selectively irradiated. Further, in order to accurately form the vias down to the bottom surface of the porous substrate and at the same time, to obtain a sufficient filling ratio of conductive material, it is required that the quantity of the beam that is capable of reaching the bottom surface of the substrate should be about 1.5 times as large as the threshold value of the quantity of the beam which is required for merely introducing a conductive material into the substrate. When the quantity of the beam of this magnitude is irradiated to the substrate, the exposure dose to the second beam-transmitting region can be confined to less than 35%.

Therefore, the transmittance or aperture ratio of the second beam-transmitting region relative to the first beam-transmitting region should preferably be not more than 50%, or more preferably not more than 35%.

The mask mentioned above is provided with two kinds of beam-transmitting regions, wherein one of them is constituted by a fine pattern, i.e. by an aggregation of fine holes or fine regions where the beam is capable of pass therethrough. The size of a single unit of the fine pattern constituting the aggregation should preferably be in the range of 0.1 μm to 10 μm. The individual fine pattern is employed not for forming a wiring or a via by itself, but for drawing a wiring or a via with an aggregation of fine patterns. Therefore, the fine pattern should not be individually resolved. Accordingly, the size of each unit of the fine pattern of mask should preferably be not larger than 10 μm. If the size of each unit of the fine pattern exceeds 10 μm, the fine pattern may be transcribed as an individual conductive pattern. Further, in order to control the impedance of the wiring, the deviation of the width and thickness of the wiring from set values thereof should preferably be confined to not more than 10%. For this purpose, the size of each fine pattern should preferably be limited to at least not larger than 10% of the width of the wiring. If each unit of the fine pattern is larger than 10 μm, it would become very difficult to form a wiring having a line width of less than 100 μm, thus making it impossible to form wirings at a high density. Incidentally, in order to enable a smooth conductive pattern to be precipitated on the occasion of forming plated pattern, the size of each unit of the fine pattern should preferably be kept 5 μm or less.

On the other hand, if the size of each unit of the fine pattern is too small, it would become very difficult to manufacture a mask provided with such a fine pattern. As a matter of fact, if the size of each unit of the fine pattern is less than 0.1 μm, the roughness of the edge portion of the mask pattern would become extremely prominent, thus resulting in the instabilization of exposure dose. Further, since the nucleation and growth process of metal is utilized according to another embodiment of the present invention, the size of the nucleus functioning as a growth point is required to be sufficiently large. Generally, the size of the fluctuation (which triggers the growth of metallic precipitation) in spinodal decomposition or in the nucleation and growth process is within the range of 0.5 to 1 μm. If the size of the fluctuation is less than 0.5 μm, it may become impossible to generate a satisfactory configuration of a metallic nucleus acting as a growth point. Therefore, the size of each unit of the fine pattern should preferably be not smaller than 0.5 μm.

As for the configuration of each unit of the fine pattern, it may be circular, triangular, square, hexagonal, or striped. A plurality of fine patterns each having a different configuration may be combined with each other. Among them, when a circular pattern is arranged in a form of a triangular lattice, the minimum distance between neighboring fine patterns can be relatively minimized and hence such an arrangement is preferable. Even in the case of a hexagonal fine pattern, it can be arranged in a form of triangular lattice and hence such an arrangement is preferable because of the same reason as mentioned above. In the case of a stripe pattern, it is preferable, in view of enhancing the electric conductivity, to arrange the stripe patterns parallel with the conductive portion.

The total aperture ratio of the entire fine patterns, i.e. the aperture ratio of the beam-transmitting region constituted by an aggregation of fine patterns, should be kept 50% or less. If this aperture ratio is larger than 50%, the beam may be allowed to pass through the opposite surfaces of a substrate, thus readily sensitizing the substrate in the same manner as that of the vacant region formed in the mask for sensitizing the via-forming regions. Therefore, it would become difficult to secure a sufficient thickness of the insulating layer existing below the wiring. As a result, it may become impossible to concurrently perform the irradiation of a beam to the interfacial conductive region and to the non-interfacial conductive region to be formed at the surface layer of a substrate. It is more preferable that the aperture ratio is kept 35% or less in view of suitably forming a conductive region only in one surface of substrate.

For example, when the fine patterns are respectively circular in configuration and arranged in a form of triangular lattice, the center-to-center distance between neighboring circles should preferably be at least twice as large as the diameter of said circle. If this center-to-center distance is too short, a difference in thickness between the interfacial conductive region and the non-interfacial conductive region would become too small. As a result, it may induce insulation defective due to an insufficient thickness of the insulating layer located below the wiring. If it is difficult to arrange CAD in a form of triangular lattice in the process of manufacturing the mask, the circular fine patterns may be arranged in a form of square lattice. In this case, the center-to-center distance between neighboring circles should preferably be at least 1.5 times as large as the diameter of said circle. When this center-to-center distance is set to 1.5 times or more as mentioned above, it would become possible to secure a sufficient difference in thickness between the interfacial conductive region and the non-interfacial conductive region. Further, when a stripe pattern is employed, the center-to-center distance between neighboring fine patterns should preferably be at least three times as large as the width of the stripe pattern which is made vacant. Since the stripe pattern is longitudinally elongated, the characteristic thereof as a point light source is relatively weak as compared with that of the circular pattern. As a result, a deep portion of the substrate can be easily irradiated. Therefore, when the center-to-center distance between neighboring fine patterns is less than three times as large as the width of the stripe pattern which is made vacant, it would become difficult to secure a sufficient difference in thickness between the interfacial conductive region and the non-interfacial conductive region.

It may be possible to reduce the intervals between the fine patterns in selectively forming a conductive wiring only in the surface region of the substrate. However, irrespective of any arrangement of patterns, if the aperture ratio is set to more than 50%, it may become difficult to selectively form a conductive wiring only in the surface region of substrate, thus failing to secure a sufficient insulation between the top and bottom surfaces of substrate.

Next, with reference to FIGS. 5A to 5D, a method for manufacturing a composite member according to one embodiment of the present invention will be explained by referring to one example where there is employed a porous body carrying a layer of a photosensitive composition comprising a compound which is capable of generating an ion-exchange group by the beam exposure.

Each of the steps will be explained as follows.

Figure 5A:
FIGS. 5A to 5D respectively shows a cross-sectional view illustrating the method for manufacturing a composite member according to a further embodiment of the present invention.

Step (1): First of all, as shown in FIG. 5A, a photosensitive composition 2 comprising a compound which is capable of generating an ion-exchange group by the light irradiation is formed on the surface of the porous substrate 1 or on the surface and interior of the porous substrate 1.

Figure 5B:
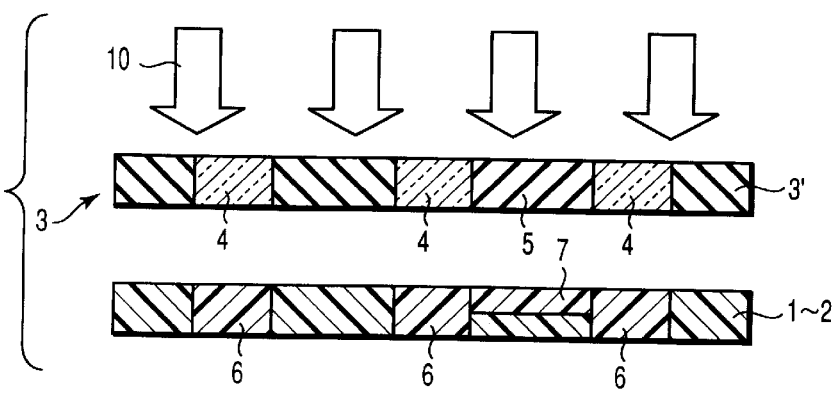

Step (2): Then, as shown in FIG. 5B, the porous substrate 1 coated with the photosensitive composition 2 is subjected to a patterning exposure through a mask 3. This mask is provided with a shielded region 3', a beam-transmitting region (hereinafter referred to as a first beam-transmitting region) 4 where the beam is permitted to completely pass through, and a beam-transmitting region (hereinafter referred to as a second beam-transmitting region) 5 which comprising an aggregation of regions or aforementioned fine patterns where the transmittance thereof is controlled to not more than 50% relative to that of the first beam-transmitting region.

As explained above, since the exposure beam 10 transmitted through the first beam-transmitting region 4 of the mask 3 is enabled to reach the bottom surface of the porous substrate 1, this exposure portion constituting a via-forming region 6 is entirely (i.e. throughout the entire thickness of the region) photo-sensitized. On the other hand, since the exposure beam 10 transmitted through the second beam-transmitting region 5 of the mask 3 is not enabled to reach the bottom surface of the porous substrate 1, only a surface portion of the irradiated region or a wiring-forming region 7 is photo-sensitized. In both of these via-forming region 6 and wiring-forming region 7, an ion-exchange group is allowed to generate.

Figure 5C:
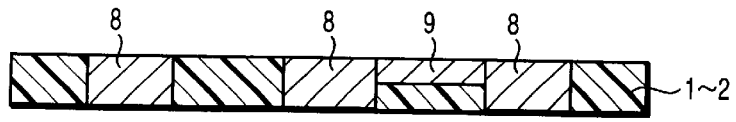

Step (3): Thereafter, the ion-exchange group which has been generated in these via-forming region 6 and wiring-forming region 7 due to the patterning exposure thereof executed in the step (2) is allowed to bond with a metal ion or a metal. As a result, as shown in FIG. 5C, vias 8 and wirings 9 are respectively formed in these via-forming region 6 and wiring-forming region 7.

Figure 5D:
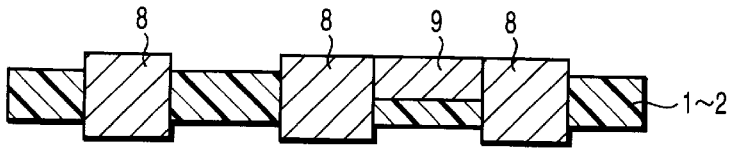

Step (4): If desired, as shown in FIG. 5D, a electroless plating may be applied to the conductive portions of these via-forming region 6 and wiring-forming region 7 so as to enhance the conductivity of the conductive portions. As a result, as shown in FIG. 5D, the vias 8 and wirings 9, each exhibiting a filling ratio of metal, are respectively formed in the predetermined regions.

Incidentally, in the step (2), a couple of masks may be employed so as to perform the exposure from the opposite surfaces of the porous insulating body. As a result, the vias penetrating from the top to the bottom of the insulating body as well as the wirings which are formed on the opposite surfaces of the insulating body and selectively connected with these vias can be simultaneously fabricated.

If desired, the substrate may be further infilled with a curable resin such as epoxy resin, benzocyclobutene (BCB) resin, polyimide, silicone resin, bismaleimide-triazine resin, etc.

As for the photo-sensitizer, it is possible to employ at least one kind of derivative selected from the group consisting of onium salt derivatives, sulfonium ester derivatives, carboxylic acid derivatives and naphthoquinone diazide derivatives which are set forth in Japanese Patent Application No. 2000-159163. For example, naphthoquinone diazide may be incorporated into a novolac resin.

Further, it is also possible to employ a chemical amplification type photo-sensitizer as set forth in Japanese Patent Application No. 2001-093668, this photo-sensitizer comprising a photo-acid generator and a polymer compound which is capable of generating an ion-exchange group in the presence of acid. If it is desired to employ such a photo-sensitizer, a heat treatment is required to be performed after the exposure in the aforementioned step (2). As a result, it is possible to realize the enhancement of sensitivity and to employ a beam of longer wavelength in the step of exposure. As a specific example of the chemical amplification type photo-sensitizer, a tetrahydropyranyl group or tertiary butyl group may be incorporated as a protective group into acrylic resin and at the same time, naphthalimide trifluoromethane sulfonate may be incorporated as a photo-acid generator into the acrylic resin.

As explained above, according to the manufacturing method of a composite member according to one embodiment of the present invention, complicated processes such as the coating of a resist to form a resist film, the etching of the resist film to form a resist pattern and the removing of the resist pattern are no longer required to be performed. Therefore, it is possible, according to one embodiment of the present invention, to simplify the manufacturing process as compared with the conventional manufacturing method of wiring board where a via-hole is formed by using photolithography or mechanical procedures. Further, since a porous body is employed as an insulating body, a step of forming a conduction portion by selectively applying a plating or a conductive paste to the substrate can be dispensed with, thereby simplifying the manufacturing operation.

Moreover, the fabrication of perforating vias and of wirings on opposite surfaces of substrate can be realized by a single step. Additionally, since the vias and wirings can be drawn on a single piece of mask, the alignment among these vias and wirings is no longer required to be performed and at the same time, the generation of misalignment of these vias and wirings can be obviated. Therefore, the land for a via is no longer required to be formed, thus making it possible to produce landless via and to enhance the densification of wirings.

The conductive wiring pattern and via, which are formed by the method according one embodiment of the present invention, are integral structures with a porous body just like a mesh filled with a conductive material. Therefore, the wiring board excellent in bending strength can be obtained, and the peeling of wirings from the substrate would never be possible in structural viewpoint. Since the region where the wirings are to be formed through the exposure thereof by using the second beam-transmitting region of mask is irradiated in such a manner that the surface portion thereof is selectively and strongly irradiated with a beam, most of the metal is allowed to precipitate at a shallow surface portion, i.e. a depth of ⅓ (as measured from the surface of the substrate) of the entire thickness of the substrate. Therefore, even if all of the wirings are simultaneously formed on the opposite surfaces of substrate, it is possible to secure an excellent insulating property. Further, since most of the metal are allowed to precipitate at the surface region, a high-frequency current which tends to flow selectively through the surface portion of metal can be preferably employed. Since the portions protruding from the surface of substrate is very small in thickness, they can be suitably laminated.

The wiring board to be formed by the method according one embodiment of the present invention is characterized in that the vias and the wirings are fabricated on a single sheet of porous substrate. In this case, the thickness of conductive wiring which is formed in a porous body and patterned by using the second beam-transmitting region should preferably be confined to 5 to 50%, more preferably 10 to 34% relative to the entire thickness of the porous substrate. If this ratio is too large, it may become impossible to secure a sufficient electric insulation between the neighboring wirings. On the other hand, if this ratio is too small, it may become impossible to secure a sufficient electric conductivity of wirings. It is preferable, for the purpose of securing a sufficient insulating property, to confine the thickness of wiring to be the same as or smaller than the thickness of the insulating layer interposed between a couple of neighboring wirings. When the aforementioned ratio in thickness of conductive wiring relative to the porous substrate is controlled to be not higher than 34%, it is possible to make the thickness of the insulating layer almost identical to the thickness of the wiring even if the wiring disposed on the top surface of substrate is intersected with the wiring disposed on the bottom surface of the substrate in the case wherein a plurality of wirings are concurrently formed on the opposite surfaces of a single sheet of porous substrate.

Further, it is required to transmit high frequency operating signals, to minimize the capacity between neighboring wirings. The inter-wiring capacity between a couple of neighboring wirings is directly proportional to the area of the surface facing the wiring and inverse proportional to a distance between a couple of neighboring wirings. The inter-wiring capacity under the condition wherein wirings each having a rectangular cross-section and arrayed horizontally and parallel with each other is directly proportional to the height of the wiring and inverse proportional to a distance between a couple of neighboring wirings (wiring-to-wiring distance). Likewise, the inter-wiring capacity under the condition wherein wirings each having a rectangular cross-section and arrayed vertically and parallel with each other thereby forming a multi-layered wiring is directly proportional to the width of the wiring and inverse proportional to a distance between a couple of neighboring wirings, i.e. the layer-to-layer distance. Therefore, it is required, if it is desired to minimize the inter-wiring capacity, to enlarge the distance between a couple of neighboring wirings and the layer-to-layer distance.

However, it is now desired to reduce the wiring-to-wiring distance as minimum as possible in the horizontal direction, in order to promote the fineness of pitch of wirings. On the other hand, the influence of the layer-to-layer distance on the length of wiring which can be accommodated in the substrate is not so strong as compared with the influence thereof on the wiring-to-wiring distance in the horizontal direction. Therefore, it is preferable to enlarge the layer-to-layer distance rather than to enlarge the wiring-to-wiring distance in the horizontal direction. Further, since the layer-to-layer distance can be increased, the width of wiring should desirably be increased more than the height of the wiring.

The wirings may be all buried inside the porous body, or may be partially exposed out of the porous body. In this case, the ratio of the thickness of the portion of the wiring which is exposed out of the porous body to the thickness of the other portion of the wiring which is formed inside the porous body should preferably be less than 50%, more preferably not more than 20%. If the thickness of the portion of the wiring which is exposed out of the porous body is excessively large, the roughness of the surface of the wiring board would become prominent, thereby raising a problem that the packaging property of the wiring board on the occasion of mounting electronic parts on the substrate would be deteriorated. Generally, with a view to enhance the electric insulation property and at the same time, to prevent the generation of migration of metal, the insulating regions of the porous substrate other than the regions where a conductive material is being filled is filled with a resin. However, since the layer which is formed outside the porous body is formed of a conductive material, the migration of metal tends to occur if the thickness of this layer is excessively large, thus deteriorating the durability of the wiring board. Therefore, it is desirable in view of most simplifying the process that the layers to be exposed outside the porous body should preferably be formed concurrent with the other layers to be formed inside the porous body by plating.

Since the scattering of the beam is positively utilized, the via as well as the wiring formed by the according to one embodiment of the present invention are configured such that the portion of thereof which is located inside the substrate is free from any angled edge. Specifically, the cross-section of the conductive wiring is reverse U-shaped or semi-circular wherein a lower portion thereof is rounded. By the term reverse U-shaped, it means that at least a couple of neighboring corners among four corners of a rectangular configuration are respectively rounded.

It should be noted that the cross-sectional configuration of the conductive wiring should preferably be rounded at the four corners thereof rather than being rectangular. More preferably, the cross-sectional configuration of the conductive wiring should preferably be reverse U-shaped wherein the brink portion of the side on which a neighboring wiring layer is closely positioned should be rounded. If the cross-sectional configuration of the conductive wiring is rectangular having four angled edges, the migration of the conductive material tends to generate due to the concentration of electric field, thus generating a dendrite and hence giving rise to electric short-circuit. Whereas, if the cross-section of the conductive wiring is rounded, the generation of migration can be prevented. Therefore, the via and the wiring formed by the method according to one embodiment of the present invention would be substantially free from the generation of migration.

Further, when the wiring is formed into a reverse U-shaped configuration in cross-section, the flow of resin would be made smooth on the occasion of impregnating the porous substrate with the resin, so that it would become possible to prevent voids from being generated at the rear side of the wiring. In particular, the rounded structure of the wiring would be especially advantageous where a resin which is poor in fluidity such as a resin having a fine filler filled therein is to be employed for impregnating the substrate with the resin.

By the term reverse U-shaped, it means that the radius of curvature of the curved portion or the rounded portion of the brink thereof is not less than ⅓, more preferably ½ of the thickness of the wiring. When the wiring is constructed in this manner, the aforementioned effects can be easily obtained. When the radius of curvature of the curved portion is too small, it would become impossible to expect the aforementioned migration-preventing effect. Further, where the relationship between the radius of curvature and the thickness of the wiring is maintained at the aforementioned range, the value of the radius of curvature should preferably be not less than 5 μm.

Further, the wiring portion of the conductive material formed by using the second beam-transmitting region according to one embodiment of the present invention is featured by the following aspects.

A first feature resides in the existence of the layer (a first layer) having a depth of several micrometers as measured from the surface of the substrate and being very high in filling ratio of a conductive material. The existence of this layer can be attributed to the fact that the surface region of the substrate is selectively strongly irradiated with a beam by using a mask provided with a fine pattern. In addition to that, it can be also attributed to the fact that as a result of the nucleation and growth process at the time of plating, a metal is allowed to precipitate prominently at the surface region of the substrate. This first layer is constituted by a layer which is constituted by the voids of the porous body, not less than 80% of which is filled with a conductive material, and a layer which is formed contiguous with the first mentioned layer and slightly protruded, depending on circumstances, from the porous body and comprises a thin conductive material. Since this first layer is predominantly constituted by a conductive material, the electric resistance thereof is very small, and additionally, since a high-frequency current flows selectively through the surface region of the wiring, the structure described above is very advantageous.

The filling ratio of a conductive material should preferably be 80% or more, more preferably 90% or more. If this filling ratio is less than 80%, it would be difficult to secure a sufficient conductivity. If the width of the wiring is increased so as to secure a sufficient conductivity, it may become difficult to enhance the densification of wirings. When it is desired to flow a high-frequency current through the wiring layer, the thickness of this wiring layer should preferably be less than 15%, more preferably not more than 10% of the thickness of the substrate. Since a high-frequency current flows substantially selectively through this layer, the thickness of this layer can be as thin as not more than 15% of the thickness of the substrate, so that it is possible to increase the distance between this layer and any underlying wiring layer by making this first layer thinner. Therefore, the matching of impedance can be easily executed.

A second feature resides in the existence of the layer (a second layer) formed contiguous with the aforementioned first layer of high filling ratio and being relatively low in filling ratio of a conductive material. The thickness of this layer should preferably be such that this layer is located at a depth ranging from 10% to 50% of the thickness of the substrate as measured from the surface of the substrate. If the thickness of this layer is larger than this range, the insulating property thereof relative to the bottom surface of the substrate would be deteriorated. The range of the thickness confined in this manner is applicable to a case where the substrate is relatively thin, so that if the thickness of the substrate is larger than 200 μm, the thickness of this layer may be within the range of 10 μm to 100 μm.

This layer is located inside the porous substrate, thus forming a structure wherein a conductive material is introduced into the interior of the substrate. Since this layer is formed, on the occasion of plating process, concurrent with the formation of the layer of conductive material having a high filling ratio of a conductive material representing the aforementioned first feature, this second layer is contiguous with the first layer. Therefore, there is little possibility that the metal wiring is peeled away from the substrate as in the case of the ordinary printed wiring substrate. Therefore, the resultant structure is very excellent in bending strength and is highly resistive to the fluctuation of temperature. The conductor-filling ratio of this layer should preferably be within the range of 10% to 80%, the most of them falling within the range of 20% to 60%.

The ratio between the aforementioned layer of high filling ratio and the aforementioned layer of low filling ratio should preferably be within the range of 2:1 to 1:5, more preferably 1:1 to 1:2. If the ratio of the aforementioned layer of high filling ratio is lower than this lower limit, the electric conductivity to be obtained relative to the width of the wiring would become insufficient, and the conductive layer may be peeled away from the substrate. On the other hand, if the ratio of the aforementioned layer of high filling ratio is higher than this upper limit, an electric contact between neighboring wirings may be accidentally occurred or leakage may be generated. Further, as explained hereinafter, a difference in thermal expansion coefficient between these layers may not be sufficiently alleviated, thereby giving rise to the fracture of the wiring. When the cross-section of wiring is reverse U-shaped, the bottom portion thereof corresponds to a layer containing a density of conductive material.

The 2-layer structure formed in this manner is effective in improving the heat resistance of the conductive portion. When the porous body is filled with a conductive material, the thermal expansion coefficient can be fluctuated depending on the aforementioned filling ratio. If the aforementioned layer of low filling ratio is not interposed between the aforementioned layer of high filling ratio and the layer where the conductive material is not charged therein, the fracture of conductive material may be caused to occur due to a difference in thermal expansion coefficient in the course of thermal hysteresis. However, since the aforementioned layer of low filling ratio and having an intermediate thermal expansion coefficient is interposed as explained above, a difference in thermal expansion coefficient between the aforementioned layer of high filling ratio and the layer containing on the conductive material can be alleviated, thereby achieving a high resistance to the thermal hysteresis of the conductive portions. However, if the filling ratio of the conductive material in the aforementioned layer of low filling ratio is too large, the effect of alleviating the difference in thermal expansion coefficient would become insufficient and a stress may be easily generated between this layer and the insulating layer. In any case, such a stress may lead to the fracture of wiring.

Incidentally, the thickness of the porous substrate to be employed in the method according to one embodiment of the present invention should preferably be within the range of 10 μm to 500 μm, more preferably, 20 μm to 200 μm.

Next, the present invention will be further explained with reference to specific examples, which are not intended to limit the scope of the present invention.

EXAMPLE 1

In this Example 1, the process for forming a wiring pattern in a porous insulating body by using a half-tone mask will be explained.

As a porous substrate, a PTFE porous sheet (the diameter of void: 500 nm, and the film thickness: 58 μm) was prepared. In the meantime, naphthoquinone diazide-containing phenol resin (the content of naphthoquinone diazide: 33 equivalent mol. %) was dissolved in acetone to prepare a 1 wt. % acetone solution as a photo-sensitizer, which was then coated on the entire surface of the porous sheet by a dipping method. As a result, not only the interior of the holes of the porous sheet but also the surface of the inner voids was covered with a photo-sensitizer.

Then, the resultant sheet was irradiated through a mask with a beam having a wavelength of 436 nm by using CANON PLA501 to generate an ion-exchange group at the irradiated or exposed portion. The mask employed in this case was a half-tone mask, the schematical construction of which being shown in FIG. 6.

Figure 6:
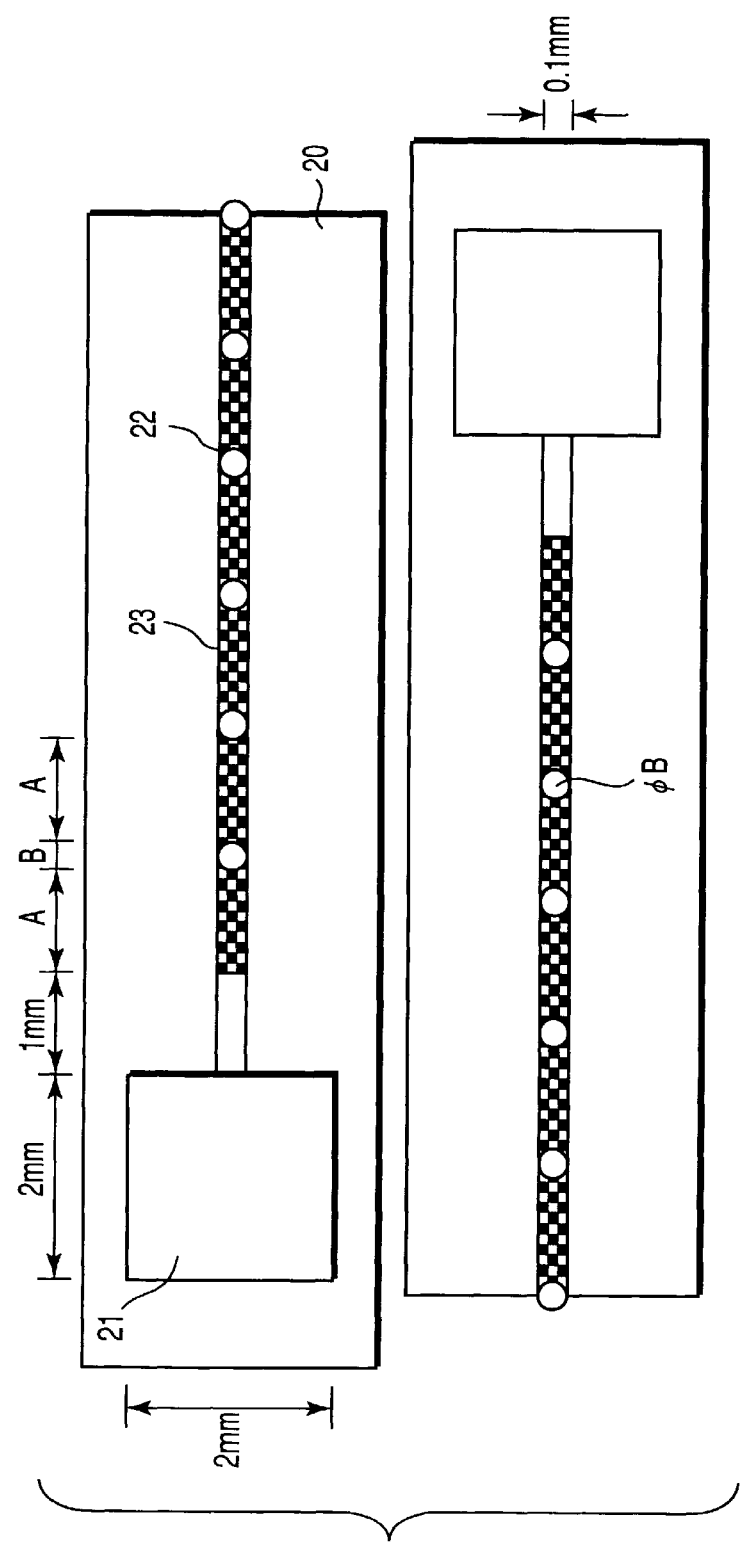
FIG. 6 shows a diagram schematically showing the construction of a mask substrate to be employed in a method according to one embodiment of the present invention.

As shown in FIG. 6, the mask 20 was provided with a beam-transmitting region 21 for photo-sensitizing a pad-forming region, with a beam-transmitting region 22 for photo-sensitizing a perforated via-forming region, and with a beam-transmitting region 23 for photo-sensitizing a non-perforated wiring-forming region. In this mask 20, the beam-transmitting region 22 for photo-sensitizing the via-forming region was constituted by a vacant pattern, whereas the beam-transmitting region 23 for photo-sensitizing the wiring-forming region was constituted by a half-tone. The entire length of the mask 20 was set to 10 mm, and the distance "A" between the neighboring beam-transmitting regions 23 was set to 0.9 mm. Further, the diameter "B" of the beam-transmitting region 22 was set to 0.025 mm, 0.05 mm, 0.075 mm and 0.1 mm. Other dimensions were as shown in FIG. 6.

The sheet having a latent image of the patterns formed by the exposure process using the aforementioned mask was immersed in a 0.5M (molar concentration) aqueous solution of copper sulfate for 5 minutes, and the resultant sheet was repeatedly washed three times with distilled water. Thereafter, the sheet was immersed in a 0.01M (molar concentration) aqueous solution of sodium borohydride for 30 minutes, and the resultant sheet was washed with distilled water to prepare a composite member. This composite member thus obtained was found having a conductive portion comprising copper formed therein.

The sheet having a conductive pattern formed therein in this manner was immersed in a plating solution of electro-less copper (PS-503) for 30 minutes to apply a copper plating to the conductive portion, thus forming a wiring portion.

When the sheet was irradiated with a beam at a dose of 1950 mJ/cm$^2$, it was possible, in the case where the light transmittance of the half-tone of mask constituting the beam-transmitting region 23 of mask was 55% (1070 mJ/cm$^2$) or more, to form a metal via in the porous sheet, the metal via penetrating from the top to bottom of the sheet. When the conductivity between the top and bottom of the via was measured, the electric resistance of the via where the light transmittance of the half-tone of mask was 90% (1770 mJ/cm$^2$) or more was found to be substantially the same as that of the via where the light transmittance of the half-tone of mask was 100%. On the other hand, in the case where the light transmittance of the half-tone of mask was within the range of 8.4% to 50% (163 mJ/cm$^2$ to 970 mJ/cm$^2$), it was possible to form a metal plating only at the surface region of the porous sheet. Among them, where the light transmittance of the half-tone of mask was not more than 35% (680 mJ/cm$^2$), it was possible to confine the thickness of conductive portion to less than a half of the thickness of the porous sheet as measured from the top surface thereof, thereby making it possible to secure a sufficient insulation between the top and bottom surfaces of porous sheet at this conductive portion, thus enabling it to be used as a conductive wiring.

Further, it was possible to inhibit the migration of the conductive portion, thus rendering the conductive portion excellent in durability. Furthermore, it was possible, through the adjustment of light transmittance of the half-tone of mask, to freely control the thickness of the conductive portion to be formed in the porous sheet to any desired value within the range of 10 to 50% relative to the thickness of the porous sheet. The thickness of the conductive layer formed outside the porous sheet was always less than 10% of the conductive portion formed inside the porous sheet. Where the light transmittance of the half-tone of mask was 8.0% or less, it was impossible to form a metal plating even on the surface of the porous sheet.

Incidentally, with regard to the regions of the porous sheet which correspond to the vacant pattern 22 of the mask 20, it was possible, in every case, to form a metal plating penetrating through the entire thickness of the porous sheet.

The size of voids of the porous substrate employed in this example was, as expressed by a radius of gyration, 0.89 to 0.96 time as large as the wavelength of the exposure beam. Further, with regard to the mask employed in this example, an average transmittance of the light-transmitting region for photosensitizing the via-forming region was about 90 to 100%, while an average transmittance of the light-transmitting region for photosensitizing the wiring-forming region was about 8.4 to 50%.

These results mentioned above demonstrated that through the employment of a mask having not only a vacant pattern at the beam-transmitting region 22 for forming a photo-sensitive region for forming a via, but also a half-tone at the beam-transmitting region 23 for forming a photo-sensitive region for forming a wiring, it was possible to simultaneously form, by a single exposure process, not only the wiring disposed only at the surface region thereof but also the via penetrating throughout the entire thickness of the porous sheet. In particular, when the light transmittance of the half-tone of mask was confined within the range of 15% to 30%, it was possible to form a surface metal wiring which was excellent in electric conductivity as well as in insulation relative to the bottom surface of the porous sheet.

EXAMPLE 2

In this Example 2, the process for forming a wiring and a via in a porous insulating body by using a mask having a fine pattern will be explained.

First of all, by the same procedures as employed in the aforementioned Example 1, a sample was prepared by coating a photo-sensitizer on the surface of an insulating body. Then, the sample was irradiated, via a mask and by using CANON PLA 501, with a beam having a wavelength of 436 nm, thereby enabling an ion-exchange group to be generated at the exposure portion. When the size of voids of the insulating body employed in this example was defined in terms of a radius of gyration as in the case of Example 1, it was 0.89 to 0.96 time as large as the wavelength of the exposure beam.

Figure 7:
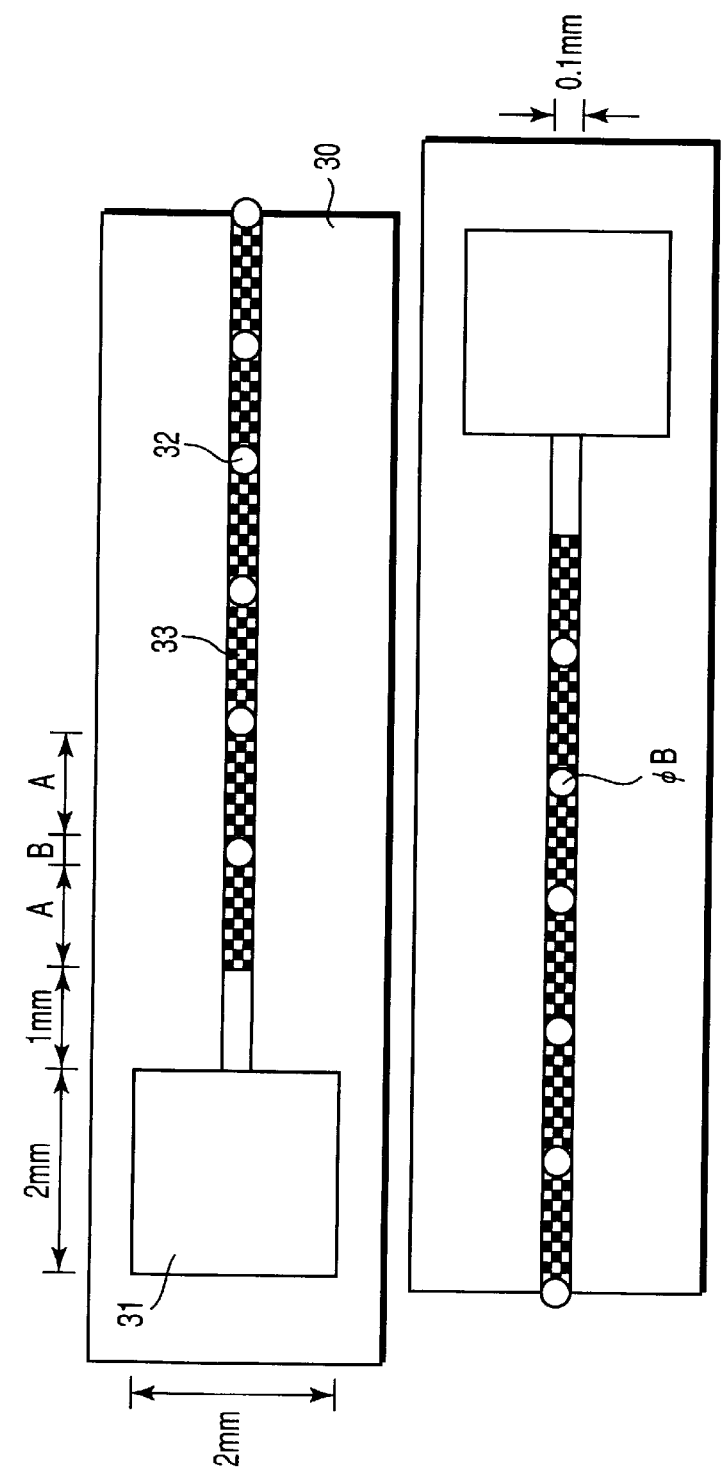
FIG. 7 shows a diagram schematically showing the construction of a mask substrate to be employed in a method according to another embodiment of the present invention.

The mask employed in this example was provided at the wiring portion thereof with a fine pattern, a schematic view of which is shown in FIG. 7.

As shown in FIG. 7, the mask 30 was provided with a beam-transmitting region 31 for photo-sensitizing a pad-forming region, with a beam-transmitting region 32 for photo-sensitizing a perforated via-forming region, and with a beam-transmitting region 33 for photo-sensitizing a non-perforated wiring-forming region. In this mask 30, the beam-transmitting region 32 for forming a photo-sensitive region for forming a via was constituted by a vacant pattern, whereas the beam-transmitting region 33 for forming a photo-sensitive region for forming a wiring was constituted by an aggregation of fine patterns. The entire length of the mask 30 was set to 10 mm, and the distance "A" between the neighboring beam-transmitting regions 33 was set to 0.9 mm. Further, the diameter "B" of the beam-transmitting region 32 was set to 0.025 mm, 0.05 mm, 0.075 mm and 0.1 mm. Other dimensions were as shown in FIG. 7. In this mask 30, the aperture ratio of the beam-transmitting region for photo-sensitizing the wiring-forming region was 3.6 to 40%.

The sheet having a latent image of the patterns formed by the exposure at an exposure dose of 1500 mJ/cm² using the aforementioned mask was immersed in a 0.5M aqueous solution of copper sulfate for 5 minutes, and the resultant sheet was repeatedly washed three times with distilled water. Thereafter, the sheet was immersed in a 0.01M aqueous solution of sodium borohydride for 30 minutes, and the resultant sheet was washed with distilled water to prepare a composite member. This composite member thus obtained was found having a conductive portion comprising copper.

The sheet having a conductive pattern formed therein in this manner was immersed in a plating solution of electroless copper (PS-503) for 30 minutes to apply a copper plating to the conductive portion, thus forming a wiring portion.

As a result, with regard to the regions of the substrate which correspond to the vacant pattern 32 of the mask 30, it was possible, in every cases, to form a metal via penetrating through the entire thickness of the sheet.

Then, investigations were performed on the configuration of the fine pattern constituting the beam-transmitting regions 33 for photo-sensitizing the region for forming the wiring as well as on the influence of the dimension of the fine pattern.

First of all, the fine pattern was constituted by a stripe pattern, and the width (L μm) of the aperture where the beam of this stripe pattern was permitted to pass through and the center-to-center distance (P μm) between the neighboring apertures were varied to prepare various kinds of masks. By using each mask, the conductive portion was formed in a porous sheet by the aforementioned procedures, the results being shown, together with the width L of the aperture and the center-to-center distance P in the following Table 1.

TABLE 1

| L (μm) | P | | | | | |
|---|---|---|---|---|---|---|
| | 1.5 L | 2 L | 2.5 L | 3 L | 4 L | 5 L |
| 1 | Penetrated to bottom surface | Penetrated to bottom surface | ○ | ○ | ○ | ○ |
| 1.5 | Penetrated to bottom surface | Penetrated to bottom surface | ○ | ○ | Δ | X |
| 2 | Penetrated to bottom surface | Penetrated to bottom surface | ○ | Δ | X | X |
| 2.5 | Penetrated to bottom surface | Penetrated to bottom surface | ○ | Δ | X | X |
| 3 | Penetrated to bottom surface | Penetrated to bottom surface | ○ | Δ | X | X |
| 4 | Penetrated to bottom surface | Penetrated to bottom surface | ○ | Δ | X | Separately resolved |
| 5 | Penetrated to bottom surface | Penetrated to bottom surface | Penetrated to bottom surface (separately resolved) | Separately resolved | Separately resolved | Separately resolved |
| 7 | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) |
| 10 | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) |
| 15 | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) |

○: A metal pattern was precipitated only at a surface region.
X: A metal pattern was not precipitated.
Δ: Although a wiring pattern was formed, the conductivity of the wiring was defective.

The following facts can be recognized from the results of Table 1. Namely, when the beam-transmitting region of the mask for forming a photo-sensitive region for forming a wiring is constituted by an aggregation of stripe patterns, the width L of the aperture of the stripe pattern should be confined within the range of 1.5 to 4 μm, and the center-to-center distance P between the neighboring apertures should be confined within the range of 2.5 to 6 μm in order to enable an excellent conductive pattern to be precipitated only at a surface region of a porous sheet.

Figure 8:
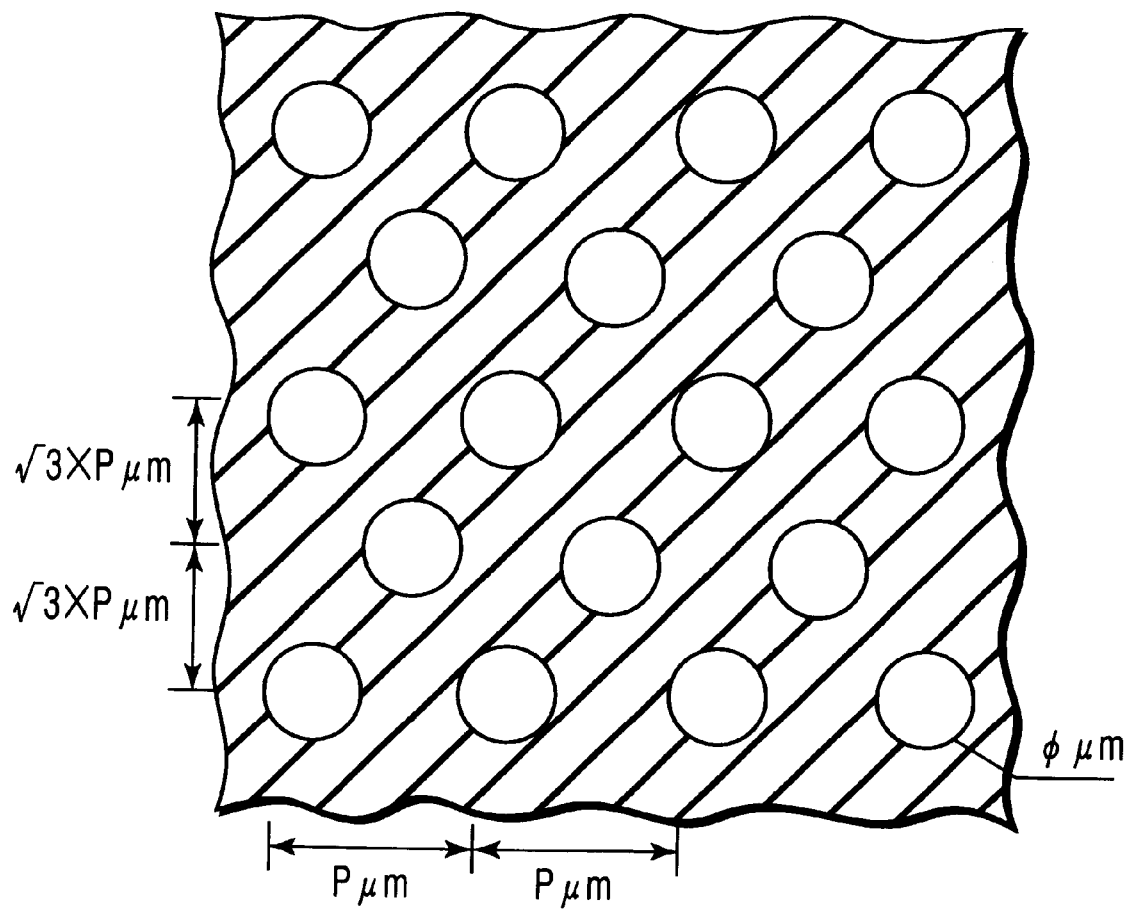
FIG. 8 shows a diagram schematically showing the arrangement of fine pattern in a mask substrate to be employed in a method according to another embodiment of the present invention.

Next, a circular dot pattern was employed as a fine pattern, and the dot pattern was arranged in a square lattice-like configuration, thereby forming a beam-transmitting region for forming a photosensitive region for forming a wiring. In this case, the diameter (φ μm) and the center-to-center distance (P μm) between the neighboring apertures were varied to prepare various kinds of masks. By using each mask, the conductive portion was formed in a porous sheet by of the aforementioned procedures, the results being shown, together with the diameter φ of the dot and the center-to-center distance P, in the following Table 2.

transmitting region for forming a photosensitive region for forming a wiring. The arrangement of the dots in the mask employed in this case is shown in FIG. 8. In this case, the triangular arrangement of dots was made with the diameter

TABLE 2

| φ(μm) | P | | | | | |
|---|---|---|---|---|---|---|
| | 1.5 φ | 2 φ | 2.5 φ | 3 φ | 4 φ | 5 φ |
| 1 | ○ | ○ | ○ | ○ | ○ | ○ |
| 1.5 | ○ | ○ | ○ | ○ | Δ | X |
| 2 | ○ | ○ | ○ | Δ | X | X |
| 2.5 | ○ | ○ | ○ | Δ | X | X |
| 3 | ○ | ○ | ○ | Δ | X | X |
| 4 | Penetrated to bottom surface | ○ | ○ | Δ | X | Separately resolved |
| 5 | Penetrated to bottom surface | Δ | Δ | Separately resolved | Separately resolved | Separately resolved |
| 7 | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) |
| 10 | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) |
| 15 | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) |

○: A metal pattern was precipitated only at a surface region.
X: A metal pattern was not precipitated.
Δ: Although a wiring pattern was formed, the conductivity of the wiring was defective.

The following facts can be recognized from the results of Table 2. Namely, when the beam-transmitting region of the mask for forming a photo-sensitive region for forming a wiring is constituted by an aggregation of circular dots which are arrayed in a square lattice pattern, the diameter φ of the dot should be confined within the range of 1 to 5 μm, and the center-to-center distance P between the neighboring dots should be confined within the range of 1.5 to 5 μm in order to enable an excellent conductive pattern to be precipitated only at a surface region of a porous sheet.

Next, a circular dot pattern was employed as a fine pattern, and the dot pattern was arranged in a triangular lattice-like configuration, thereby forming a beam-being set to φ μm and the center-to-center distance between the neighboring dots being set to P μm. As shown in FIG. 8, the remotest center-to-center distance of the neighboring dots can be represented by $\sqrt{3} \times P$ μm.

Then, the diameter (φ μm) of the dot and the center-to-center distance (P μm) between the neighboring apertures were varied to prepare various kinds of masks. Thereafter, the conductive portion was formed in a porous sheet by the aforementioned procedures using each of these masks, the results being shown, together with the diameter φ of the dot and the center-to-center distance P, in the following Table 3.

TABLE 3

| φ(μm) | P | | | | | |
|---|---|---|---|---|---|---|
| | 1.5 φ | 2 φ | 2.5 φ | 3 φ | 4 φ | 5 φ |
| 1 | Penetrated to bottom surface | ○ | ○ | ○ | ○ | ○ |
| 1.5 | Penetrated to bottom surface | ○ | ○ | ○ | Δ | X |
| 2 | Penetrated to bottom surface | ○ | ○ | Δ | X | X |
| 2.5 | Penetrated to bottom surface | ○ | ○ | Δ | X | X |
| 3 | Penetrated to bottom surface | ○ | ○ | Δ | X | X |
| 4 | Penetrated to bottom surface | ○ | ○ | Δ | X | Separately resolved |
| 5 | Penetrated to bottom surface | ○ | Penetrated to bottom surface (separately resolved) | Separately resolved | Separately resolved | Separately resolved |

TABLE 3-continued

| φ(μm) | 1.5 φ | 2 φ | 2.5 φ | 3 φ | 4 φ | 5 φ |
|---|---|---|---|---|---|---|
| 7 | Penetrated to bottom surface (separately resolved) | Δ | Penetrated to bottom surface (separately resolved) | Penetrated to bottom surface (separately resolved) | Penetrated to bottom surface (separately resolved) | Penetrated to bottom surface (separately resolved) |
| 10 | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) |
| 15 | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) |

○: A metal pattern was precipitated only at a surface region.
X: A metal pattern was not precipitated.
Δ: Although a wiring pattern was formed, the conductivity of the wiring was defective.

The following facts can be recognized from the results of Table 3. Namely, when the beam-transmitting region of the mask for forming a photo-sensitive region for forming a wiring is constituted by an aggregation of circular dots which are arrayed in a triangular lattice pattern, the diameter φ of the dot should be confined within the range of 2 to 5 μm, and the center-to-center distance P between the neighboring dots should be confined within the range of 4 to 8 μm in order to enable an excellent conductive pattern to be precipitated only at a surface region of a porous sheet.

Further, it was possible, through the adjustment of the beam transmittance by adjusting the aperture ratio of the mask pattern of the second beam-transmitting region, to freely control the thickness of the conductive material portion formed in the porous sheet so as to confine it within the range of 5 to 50% relative to the thickness of the porous sheet. The thickness of the conductive layer formed outside the porous sheet was always less than 10% of the conductive portion formed inside the porous sheet. When the picture of the cross-section of the substrate that had been manufactured in Example 2 by using the second beam-transmitting region was taken, there was recognized a tendency that the thickness of the conductive layer was thinner than that of the substrate prepared in Example 1.

Further, there was observed, through the comparison between the sample of Example 1 and the sample of Example 2 both samples being provided respectively with a conductive layer having the same thickness with each other, that a very large quantity of metal was precipitated on the surface of the substrate of Example 2 as compared with the substrate prepared in Example 1. It was confirmed that this metal was segregated at a region ranging from the top surface of the substrate to a depth of several micrometers, thereby forming a dense metal layer, and that the filling ratio of the metal was very low at the region deeper than this metal layer. Further, the cross-sectional view of wiring layer was found reverse U-shaped. For example, in the case of the wiring which was formed by using the mask 30, the radius of curvature of the rounded edge portion of the dense metal layer was 10 μm or not less than ⅓ of the thickness of the wiring layer.

Further, the sample which was subjected to the exposure process was found comprising a densely packed layer where the voids of the exposed surface portion of porous substrate were densely filled with a conductive material, and a layer which was low in filling ratio of the metal. The thickness of each of this couple of layers under various conditions is shown below.

In the case of the stripe pattern, the average values of the thickness of the layer where the filling ratio of the conductive material was 80% or more and of the thickness of the layer where the filling ratio of the conductive material was less than 80% were as shown below.

| P | Not less than 80% | Less than 80% |
|---|---|---|
| 2.5 L | 14 μm | 26 μm |
| 3 L | 10 μm | 15 μm |
| 4 L | 7 μm | 10 μm |
| 5 L | 5 μm | 8 μm |

In the case of the fine pattern which was arranged in a form of square lattice, the average values of the thickness of the layer where the filling ratio of the conductive material was 80% or more and of the thickness of the layer where the filling ratio of the conductive material was less than 80% were as shown below.

| P | Not less than 80% | Less than 80% |
|---|---|---|
| 1.5 L | 15 μm | 30 μm |
| 2 L | 10 μm | 18 μm |
| 2.5 L | 7 μm | 15 μm |
| 3 L | 5 μm | 11 μm |
| 4 L | 3 μm | 9 μm |
| 5 L | 2 μm | 6 μm |

In the case of the fine pattern which was arranged in a form of triangular lattice, the average values of the thickness of the layer where the filling ratio of the conductive material was 80% or more and of the thickness of the layer where the filling ratio of the conductive material was less than 80% were as shown below.

| P | Not less than 80% | Less than 80% |
|---|---|---|
| 1.5 L | — | — |
| 2 L | 12 μm | 20 μm |
| 2.5 L | 9 μm | 15 μm |
| 3 L | 7 μm | 9 μm |
| 4 L | 5 μm | 8 μm |
| 5 L | 3 μm | 5 μm |

As explained above, there were observed a densely packed layer where the voids of porous substrate were densely filled with a conductive material, and a layer which was low in filling ratio of the conductive material. In particular, the actual filling ratio of the layers shown in these tables as having a filling ratio of not less than 80% was 90% or more. On the other hand, the actual filling ratio of the layers shown in these tables as having a filling ratio of less than 80% was about 60% in average.

The wiring structure obtained in this example was excellent in high-frequency characteristics. Further, there was scarcely recognized the generation of migration and was also excellent in durability.

EXAMPLE 3

In this Example 3, the process for simultaneously forming a couple of wiring patterns on the opposite surfaces of substrate and a via in the substrate will be explained.

As a porous substrate, a PTFE porous sheet (the diameter of void: 600 nm, and the film thickness: 102 μm) was employed. In the meantime, a sample was prepared by coating the substrate with a photo-sensitizer by the same method as described in Example 1 except that this insulating film was employed as the porous substrate.

As for the mask to be employed for performing the exposure from the opposite surfaces of the sample, a mask comprising a top sheet and a bottom sheet each provided, at the wiring portions thereof, with a fine pattern was prepared.

Figure 9:
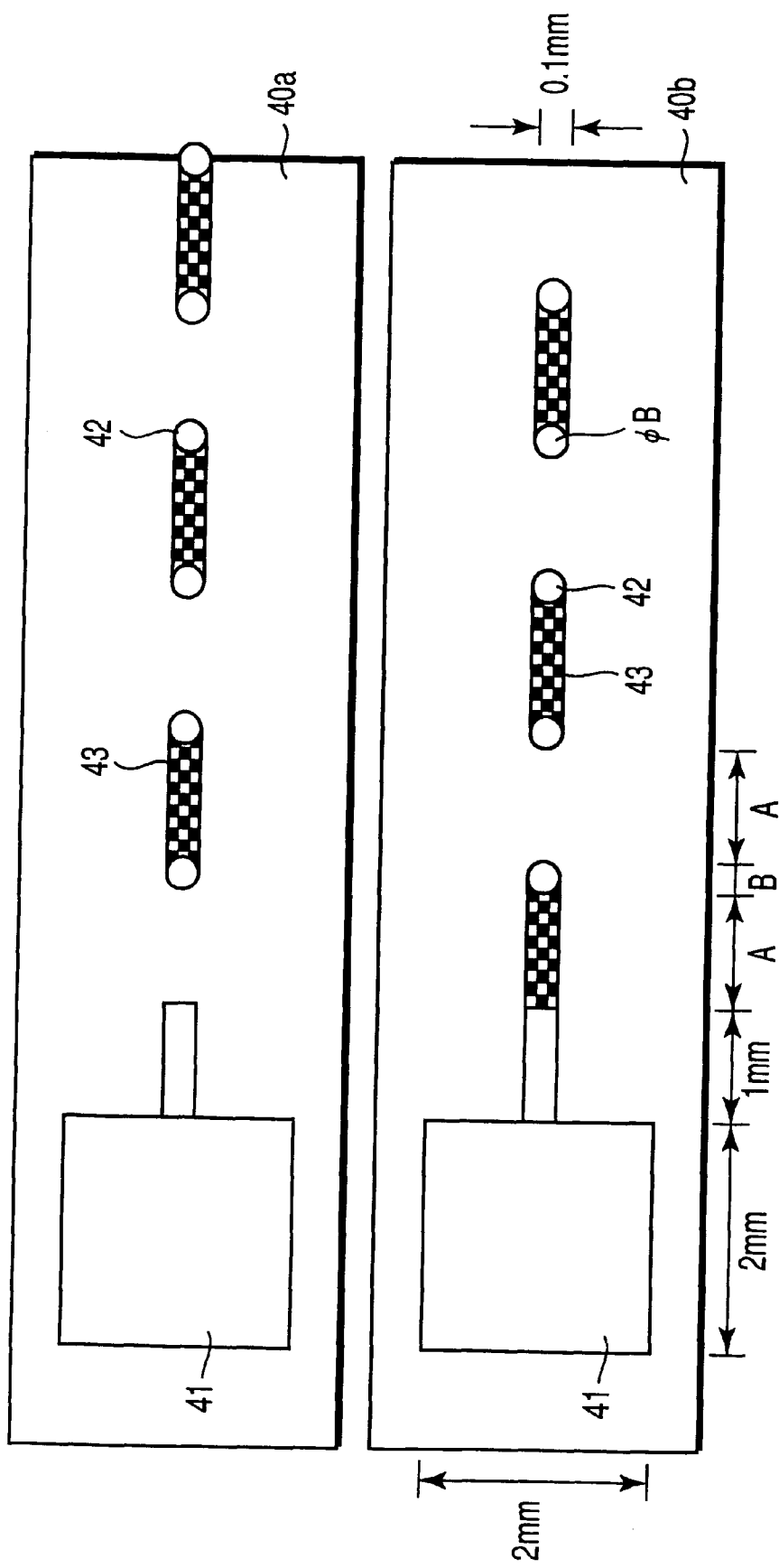
FIG. 9 shows a diagram schematically showing the construction of a mask substrate to be employed in a method according to a further embodiment of the present invention.

The schematic structure of the mask employed herein is shown in FIG. 9.

As shown in FIG. 9, the mask was constituted by a combination of a pear of masks, i.e. a top surface exposure mask 40a and a bottom surface exposure mask 40b. These masks 40a and 40b were provided respectively with a beam-transmitting region 41 for photo-sensitizing a pad-forming region, with a beam-transmitting region 42 for photo-sensitizing a perforated via-forming region, and with a beam-transmitting region 43 for photo-sensitizing a non-perforated wiring-forming region. In this mask, the beam-transmitting region 42 for forming a photo-sensitive region for forming a via was constituted by a vacant pattern, whereas the beam-transmitting region 43 for forming a photo-sensitive region for forming a wiring was constituted by an aggregation of fine patterns.

The entire length of each of these masks 40a and 40b was set to 10 mm, and the distance "A" between the neighboring beam-transmitting regions 43 was set to 0.1 mm, 0.2 mm, 0.4 mm and 0.9 mm. Further, the diameter "B" of the beam-transmitting region 42 was set to 0.025 mm, 0.05 mm, 0.075 mm and 0.1 mm. Other dimensions were as shown in FIG. 9.

As for the fine pattern to be formed in the beam-transmitting region 43 of the mask, a dot pattern was employed and arranged in a form of triangular lattice. A mask wherein the diameter (φ μm) of the aperture of a dot for permitting the beam to pass through was set to 3 μm as well as a mask wherein the diameter (φ μm) of the aperture of dot for permitting the beam to pass through was set to 4 μm were prepared. In these masks 40a and 40b, the center-to-center distance between neighboring openings was set to twice the diameter of the dot. In these masks 40a and 40b, the aperture ratio of the beam-transmitting region for photo-sensitizing the wiring-forming region was set to about 22.66%.

The sample was sandwiched between a couple of these masks which were aligned with each other by using marks so as to make the wiring and the via formed on the top mask agree with those formed on the bottom mask. Then, by using CANON PLA 501, the top mask was irradiated with a beam having a wavelength of 436 nm at an exposure dose of 1200 mJ/cm$^2$, and the bottom mask was irradiated likewise with a beam having a wavelength of 436 nm at an exposure dose of 1200 mJ/cm$^2$, thereby enabling an ion-exchange group to generate at the exposure portions as well as at the penetrating via portions of these top and bottom masks. This operation is equivalent as concurrent exposure of both sides of the substrate. The size of voids of the porous substrate employed in this example was, as expressed by a radius of gyration, 0.89 to 0.96 time as large as the wavelength of the exposure beam.

The sheet having a latent image of the patterns formed therein was immersed in a 0.5M aqueous solution of copper sulfate for 5 minutes, and the resultant sheet was repeatedly washed three times with distilled water. Thereafter, the sheet was immersed in a 0.01M aqueous solution of sodium borohydride for 30 minutes, and the resultant sheet was washed with distilled water to prepare a composite member. This composite member thus obtained was found having a conductive portion comprising copper.

The sheet having a conductive pattern formed therein in this manner was immersed in a plating solution of electroless copper (PS-503) for 30 minutes to apply a copper plating to the conductive portion, thus forming a wiring portion.

As a result, irrespective of the kinds of the masks where the diameter of the aperture of dot pattern was set to 3 μm or 4 μm, it was possible to form a daisy chain structure wherein, just like a seam line, the wirings were formed alternately on the top and bottom surfaces of the porous substrate, and the wirings of the top surface were connected with the wirings of the bottom surface of the substrate. When the cross-sectional view of the wiring was observed, the wiring was found constituted by a highly densified layer having a filling ratio of 90% and a thickness of 10 μm, and a less densified layer having a filling ratio of 65% and a thickness of 20 μm.

With a view to investigate the durability relative to the thermal hysteresis of this daisy chain structure, a temperature cycle test was performed on the sample of this example. The porous substrate prepared in this example was impregnated with benzocyclobutene resin (Dow Chemicals Co. Ltd.) and then, thermally cured for two hours under a pressurized nitrogen gas stream and at a temperature of 220° C. to obtain a resin-impregnated porous substrate. The resultant porous substrate was then subjected to a heat cycle wherein it was heated for 10 seconds at a temperature of 260° C. and then, cooled for 20 seconds at a temperature of 0° C. This heat cycle was repeated 500 times to investigate any fluctuation of electric resistance between the pads of the daisy chain. The heating and cooling of the substrate was performed by dipping the porous substrate having the daisy chain formed therein into a silicone oil heated or cooled to an appropriately controlled temperature for a predetermined time. The measurement of the electric resistance was performed by a four-probe method. As a result, the fluctuation of the electric resistance was confined to not more than 10% of the initial resistivity before the test even after a repetition of 1000 times of the aforementioned cycle of heating and cooling, thus demonstrating an excellent heat cycle resistance of this daisy chain.

EXAMPLE 4

In this Example 4, the fabrication of a couple of wiring patterns on the opposite surfaces of substrate and a via in the substrate was performed simultaneously by a single exposure process, and the resultant composite member was investigated with respect to the insulating property thereof.

As a porous substrate, a PTFE porous sheet (the diameter of void: 600 nm, and the film thickness: 102 μm) was employed. In the meantime, a sample was prepared by coating the substrate with a photo-sensitizer by the same method as described in Example 1 except that this insulating sheet was employed as the porous substrate.

By using the same pattern as employed in the aforementioned Example 2 except that the vacant portion corresponding to the via was removed from the mask 30 having a circular pattern disposed in a form of triangular lattice, a sample was irradiated, by using CANON PLA 501, with a beam having a wavelength of 436 nm at an exposure dose of 1200 mJ/cm$^2$, thereby enabling an ion-exchange group to be generated at the exposure portion. When the size of voids of the insulating body employed in this example was defined in terms of a radius of gyration as in the case of Example 1, it was 0.89 to 0.96 times as large as the wavelength of the exposure beam.

Then, the PTFE porous sheet was turned inside out, and the mask was disposed so as to intersect with the wiring which was exposed beforehand. Then, the bottom surface of the sheet was also subjected to the exposure in the same manner as explained above at an exposure dose of 1200 mJ/cm$^2$.

The sheet having a latent image of the patterns formed therein was immersed in a 0.5M aqueous solution of copper sulfate for 5 minutes, and the resultant sheet was repeatedly washed three times with distilled water. Thereafter, the sheet was immersed in a 0.01M aqueous solution of sodium borohydride for 30 minutes, and the resultant sheet was washed with distilled water to prepare a composite member. This composite member thus obtained was found having a conductive portion comprising copper.

Then, the sheet having a conductive pattern formed therein in this manner was further immersed in a plating solution of electroless copper (PS-503) for 30 minutes to apply a copper plating to the conductive portion, thus forming a wiring portion.

As a result, it was possible to form a wiring structure wherein the wiring formed in the top surface region of the sheet was orthogonally intersected with the wiring formed in the bottom surface region of the sheet. The resultant sheet was then impregnated with benzocyclobutene resin (Dow Chemicals Co. Ltd.) and thermally cured for two hours under a pressurized nitrogen gas stream and at a temperature of 220° C. to obtain a resin-impregnated porous substrate. The resultant porous substrate was then investigated with respect to the insulating property between a couple of wirings intersecting with each other, the results obtain are shown in the following Table 4.

TABLE 4

| | | P | | | | |
|---|---|---|---|---|---|---|
| φ(μm) | 1.5 φ | 2 φ | 2.5 φ | 3 φ | 4 φ | 5 φ |
| 1 | Defective insulation | ○ | ○ | ○ | ○ | ○ |
| 1.5 | Defective insulation | ○ | ○ | ○ | Δ | X |
| 2 | Defective insulation | ○ | ○ | Δ | X | X |
| 2.5 | Defective insulation | ○ | ○ | Δ | X | X |
| 3 | Defective insulation | ○ | ○ | Δ | X | X |
| 4 | Defective insulation | ○ | ○ | Δ | X | X |
| 5 | Defective insulation | ○ | Defective insulation | X | X | X |
| 7 | Defective insulation | Defective insulation | Defective insulation | X | X | X |
| 10 | Defective insulation | Defective insulation | Defective insulation | X | X | X |
| 15 | Defective insulation | Defective insulation | Defective insulation | X | X | X |

○: A metal pattern was precipitated, and the insulation between the wiring of the top surface region and the wiring of the bottom surface region was satisfactory.
X: A metal pattern was not precipitated, or separately formed, thereby rendering the metal pattern useless as a wiring.
Δ: Although a wiring pattern was formed, the conductivity of the wiring was defective.

It can be recognized from the results of Table 4 that when a wiring was prepared by using a mask having a fine pattern wherein the diameter φ of aperture was 7 μm or more, it was impossible to secure a satisfactory insulation due to an undesirable electric connection between the top and bottom surfaces of the porous sheet. Further, when the center-to-center distance P between neighboring fine patterns was as short as 1.5φ or less, it was impossible to secure a satisfactory insulation due to an undesirable electric connection between the top and bottom surfaces of the porous sheet. On the other hand, in the case of a sample wherein the center-to-center distance P between neighboring fine patterns was as long as 12 μm or more, it was impossible to secure a satisfactory conductivity between the fine patterns formed within the same plane, thereby making it impossible to employ the fine pattern as a wiring.

As explained above, when it is desired to perform the exposure of a porous sheet in such a manner that one of the opposite surfaces of the porous sheet is subjected at first to the exposure through a predetermined mask, and then, the other surface of the porous sheet is subjected to the exposure through the same mask, there is a prescribed condition for precipitating an excellent conductive pattern at only the surface region of the porous sheet for enabling the conductive pattern to function as a wiring while securing a satisfactory insulation between the top surface and the bottom surface of the porous sheet. For example, when the beam-transmitting region of the mask for forming a photo-sensitive region for forming a wiring is constituted by an aggregation of circular dots wherein the fine pattern is arranged in a form of triangular lattice as in the case of this example, the diameter $\phi$ of the dot should be confined within the range of 1 to 5 $\mu$m, and the center-to-center distance P between the neighboring dots should be confined within the range of 2 to 10 $\mu$m.

Furthermore, a resin-impregnated porous substrate where the wiring thereof was formed by using a fine pattern of dots 2 $\mu$m in diameter and 5 $\mu$m in the center-to-center distance between neighboring dots, which were formed into a triangular lattice, was subjected to a high-temperature/high-humidity bias test. First of all, when the cross-section of the resin-impregnated porous substrate was observed, it was found reverse U-shaped, and the radius of curvature of the rounded edge portion thereof was not less than ⅓ of the thickness of the wiring layer. The generation of voids was not observed on the occasion of impregnating the substrate with a resin.

Then, the resin-impregnated porous substrate was placed inside a high-temperature/high-humidity tank which was kept at a temperature of 85° C. and a humidity of 85%, and a voltage of DC12V or DC60V was applied between an intersecting wirings for 500 hours. After finishing the application of these voltages to the wirings, the resistance between the intersecting wirings was measured by a four-probe method, thus finding it as being 50M$\Omega$ or more in every instances, indicating that the substrate retained an excellent insulating property. Further, the generation of dendrite due to the migration of materials was not observed at the intersecting region of the upper and lower wirings. It was found from these results that the resin-impregnated porous substrate thus obtained was substantially free from the generation of migration and was excellent in high-temperature/high-humidity resistance. Then, this resin-impregnated porous substrate was subjected to a temperature cycle test in the same manner as conducted in Example 2 to observe any fluctuation of electric resistance between the pads of the wirings. As a result, the fluctuation of the electric resistance was confined to not more than 10% of the initial resistivity before the test even after the temperature cycle test, thus demonstrating an excellent heat cycle resistance thereof without inviting the fracture of wirings.

A wiring pattern was prepared by a process wherein a copper foil having a thickness of 12 $\mu$m was adhered on the surface of a porous sheet made of the same kind of insulating material as employed as described above, and the copper foil was patterned by the ordinary photolithography. Then, the resultant wiring pattern was subjected to the same temperature cycle test as described above, finding the generation of insulation failure that was assumed to be originated from a partial migration. From these results, the wiring having a reverse U-shaped cross-section that was formed according to the method of this example was found excellent in migration resistance.

Incidentally, the porous sheet provided with a conductive portion comprising a wiring and a via can be impregnated with a resin according to the method set forth below, which comprising:

impregnating the porous sheet having a conductive portion formed thereon with a photo-curable resin through only either one of the top and bottom surfaces of the sheet;

irradiating the sheet with a beam from one surface of the sheet which is disposed opposite to the surface through which the photo-curable resin is impregnated to cure the photo-curable resin; and removing a portion of the photo-curable resin which is left uncured.

Next, procedures of this method will be explained with reference to FIGS. 10A to 10D.

First of all, as shown in FIG. 10A, a porous sheet 51 having a via 52 and wiring (not shown) formed therein is prepared. The reference number 53 represents a porous substrate which is not filled with a conductive material. Then, as shown in FIG. 10B, a porous sheet 51 is impregnated with a photo-curable resin through one surface 51A thereof. On this occasion, as far as the via 52 is concerned, although the end face 52A located on the surface 51A side is covered with the photo-curable resin, the end face 52A located on the surface 51A side is not covered with the photo-curable resin.

As for the photo-curable resin, it is possible to employ a material wherein a photo-sensitive catalyst such as a photo-radical-generator, a photo-acid generator, a photo-base-generator, etc. is added to a resin which is curable by addition polymerization or condensation polymerization such as acrylic resin, epoxy resin, polyimide resin, polybenzoxazole resin, silicone resin, etc.

The photo-curable resin can be impregnated into the porous sheet by a procedure wherein a solution of monomer or oligomer of the photo-curable resin in a solvent is impregnated into the porous sheet, or the monomer or oligomer of the photo-curable resin itself, i.e. without dissolving it in a solvent, is impregnated into the porous sheet. It is preferable that the monomer or oligomer of the photo-curable resin is impregnated into the porous sheet without dissolving it in a solvent in order to prevent the solvent or a reaction product from being generated after the curing of the resin. It is also preferable that the photo-curable resin is free from any additive which may deteriorate the electric insulation property of the cured resin.

Then, as shown in FIG. 10C, a beam 54 is irradiated to the porous sheet 51 through one surface 51B thereof which is disposed opposite to the surface 51A through which the photo-curable resin is impregnated to cure the photo-curable resin. As for the beam useful in this case, it is possible to employ a visible beam, ultraviolet ray, or an energy beam such as an electromagnetic wave of short wavelength, X-ray and electron beam. As for the light source, it can be selected depending on the kind of photo-curable resin. For example, it is possible to employ a low pressure mercury lamp, a high pressure mercury lamp, an ultra-high pressure mercury lamp, an ultraviolet source such as a xenon lamp, a visible light source, etc. The beam to be irradiated may be a diffusion beam or a parallel beam. However, in order to enable a via to effectively shield the irradiating beam, the employment of the parallel beam is most preferable.

Although the photo-curable resin impregnated into the porous sheet 51 is cured through the irradiation of beam, the beam is shielded by the via 52. Therefore, the resin covering the end surface 52A of the via 52 is prevented from being cured.

Then, a portion of the photo-curable resin which is left uncured is removed from the porous resin sheet after the irradiation of beam. As for the method of removing the uncured portion of the photo-curable resin, there is not any particular limitation. For example, the uncured portion of the photo-curable resin may be washed out by using a solvent or a developing solution. Alternatively, a supercritical fluid such as supercritical $CO_2$ or a subcritical fluid may be employed for washing out the uncured portion of the photo-curable resin. Further, the uncured portion of the photo-curable resin can be chemically decomposed by using an etching solution or an etching gas, or can be blown away by a gas flow such as an air knife. Alternatively, a sand blast method may be employed for removing the uncured portion of the photo-curable resin. Furthermore, the uncured portion of the photo-curable resin may be removed by centrifugal force which can be effected by simply rotating the porous sheet. Depending on circumstances, the uncured portion of the photo-curable resin may be sucked away by using an absorbent or wiped away by using a cloth or a brush.

By any of the aforementioned methods, the photo-curable resin covering the resin-impregnated side 52A of the via can be removed to expose the resin-impregnated side 52A as shown in FIG. 10D. As for the beam-irradiating end face of the via, since it is exposed originally, a resin-impregnated porous sheet where the both ends of the via 52 are exposed can be obtained without necessitating a masking or a patterning exposure.

It is possible, in this manner, to effectively impregnate the porous sheet with a resin while ensuring the electric connection of the via.

Figure 11:
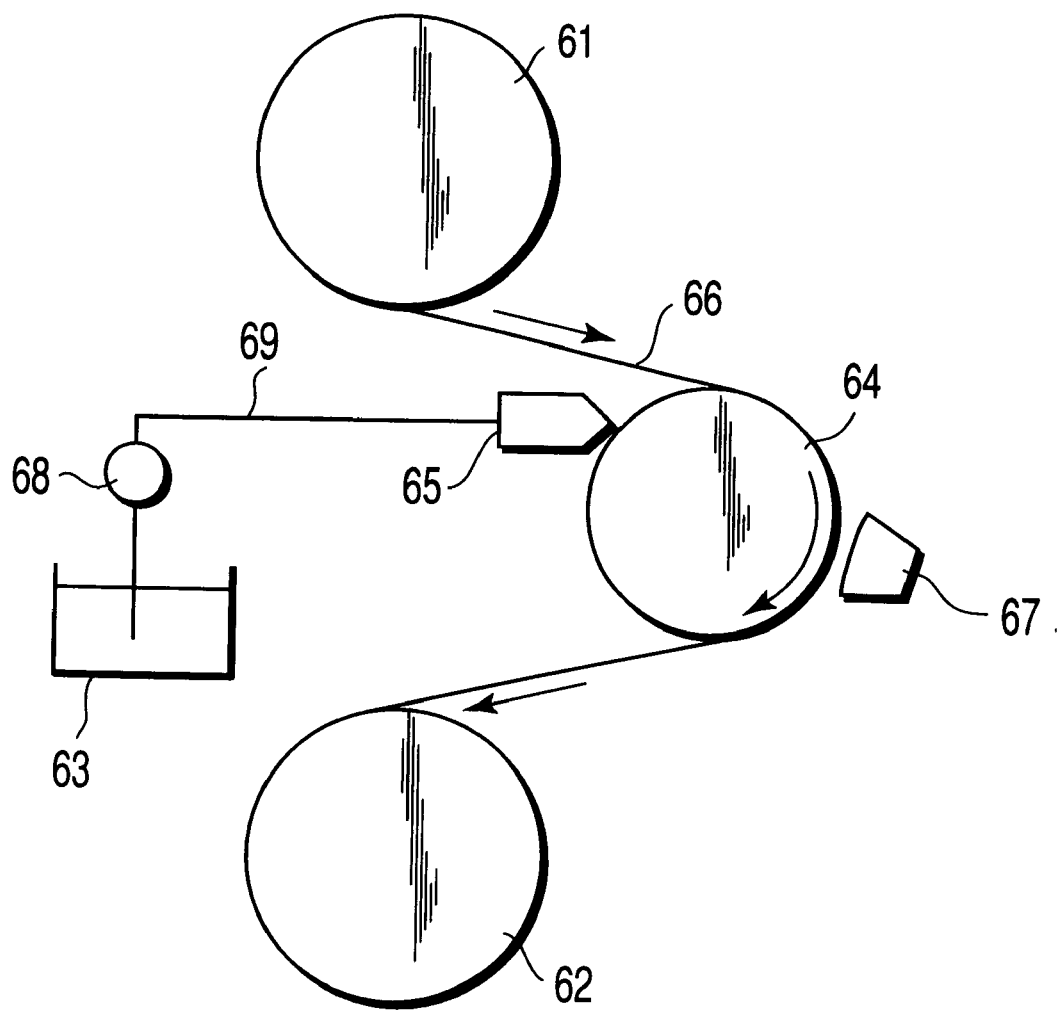
FIG. 11 shows a diagram schematically showing the manufacturing method of a composite member according to a further embodiment of the present invention wherein a roll-like substrate was employed.

When it is desired to impregnate the porous sheet with a resin and to cure the resin in the aforementioned method, it is preferable to employ an apparatus as shown in FIG. 11.

In the apparatus shown in FIG. 11, a porous sheet 66 is tensely wound around a feeding roll 61, an impregnating roll 64 and a take-up roll 62, and can be moved from the feeding roll 61 to the take-up roll 62 by a driving device (not shown). Further, a coating device 65 for coating an impregnating resin on the surface of the roll 64 is disposed close to the impregnating roll 64. A resin is designed to be fed from an impregnating resin storage vessel 63 via a pipe line 69 to the coating device 65 by a pump 68. On the side of the porous sheet which is located opposite to the resin-impregnating side thereof, there is disposed a light source 67.

By using the aforementioned apparatus, the impregnation and curing of a resin can be performed as explained below.

First of all, by using the coating device 65, a photo-curable resin is coated to a uniform thickness on the surface of the impregnating roll 64. Then, the porous sheet 66 is fed from the feeding roll 61 to the impregnating roll 64 carrying thereon a coated film of the photo-curable resin. The porous sheet 66 is press-contacted with the impregnating roll 64 to enabling the photo-curable resin deposited on the surface of the roll 64 to be impregnated into the porous sheet 66.

Under the condition where the porous sheet 66 is wound around the impregnating roll 64, or after the porous sheet 66 is moved away from the impregnating roll 64, a beam from the light source 67 is irradiated to the surface of the porous sheet 66 which is located opposite to the surface thereof which has been impregnated with the photo-curable resin, thereby allowing the resin to cure. The impregnating quantity of the photo-curable resin can be controlled depending on the thickness of the coated film formed on the surface of the impregnating roll 64.

The employment of the aforementioned apparatus is preferable, since the apparatus makes it possible to continuously perform the impregnation of resin into the porous sheet and the curing of resin.

The followings illustrate a specific example of such procedures.

First of all, by the same procedures as described in Example 4, via and wirings were formed in a porous sheet to obtain a composite member. In this example, one hundred vias was formed in a porous sheet. As a photo-curable polymer, Gelest Zipcone UA (trademark; Chisso Corporation) was prepared, and this polymer was coated on the surface of a glass substrate by a doctor blade method, thereby forming a resinous layer having a thickness of 20 $\mu$m. Then, the aforementioned composite member was disposed over the resinous layer, thereby allowing the photo-curable polymer to be infilled into the porous sheet. Incidentally, the end face of the via and the wirings which were located on the side opposite to the glass substrate were not covered with the photo-curable polymer.

After being impregnated with the photo-curable polymer, the porous sheet was irradiated with ultraviolet ray emitted from a high-pressure mercury lamp which was disposed on the side thereof which was opposite to the side where the glass substrate was disposed. As a result, the photo-curable polymer was allowed to cure. The beam thus irradiated was shielded by the wirings and the vias. Therefore, as far as the glass substrate side of the porous sheet is concerned, the photo-curable polymer covering the end faces of the wirings and of the vias is prevented from being cured. After the irradiation of beam, the composite member is peeled away from the glass substrate and washed with acetone to remove the uncured portion of the photo-curable polymer. As a result, the photo-curable polymer covering the end faces of the conductive portions such as the wirings and the vias is removed, thus obtaining a composite member filled with the photo-curable polymer and having the exposed end faces of the conductive portions.

When the electric conductivity of the vias was investigated, it was confirmed that 100% of the vias were electrically conductive.

For the purpose of comparison, a composite member was manufactured by the same procedures as described above except that after the impregnation of a resin, the end faces of vias located on the resin-impregnating side were wiped with a filter paper. When the electric conductivity of the vias was investigated, 30% of the vias were found defective in electrical conductivity.

EXAMPLE 5

In this Example 5, one example where a chemical amplification type photo-sensitizer agent was employed is explained.

First of all, one part by weight of naphthal imide trifluoromethane sulfonate as a photo-acid generator was added to 100 parts by weight of a random copolymer comprising polymethyl methacrylate and polytetrahydromethacrylate (65 mol %:35 mol %; Mw=40000). Then, the resin and the photo-acid generator were dissolved in acetone to obtain an acetone solution (containing one weight part of solid matter containing the resin and the photo-acid generator on the basis of 100 parts by weight of acetone), thereby preparing a photo-sensitive composition.

As an insulating body, a PTFE porous film (500 nm in diameter of void, and 20 $\mu$m in film thickness) was employed, and the aforementioned photo-sensitive composition was coated on the entire surface of the film by dipping method. By this coating operation, the surfaces of inner voids as well as of the holes of porous film were covered with the photosensitive composition.

Then, by using i-beam ($\lambda$=365 nm) that is a bright line of mercury lamp, the aforementioned film was irradiated, via a prescribed mask, at an exposure dose of 300 mJ/cm$^2$ to form a latent image at the exposure portions of the film. When the size of voids of the insulating body employed in this example was defined in terms of a radius of gyration, it was 1.06 to 1.10 time as large as the wavelength of the exposure beam.

In this example, a mask 30 which was provided with a fine pattern comprising circular dots and formed into a form of triangular lattice as explained in Example 2 was employed. Subsequently, the film was heated over a hot plate to promote the deprotection reaction so as to allow an ion-exchange group to generate at the exposure portions.

The sheet having a latent image of the patterns was immersed in a 0.5M aqueous solution of copper sulfate for 5 minutes, and the resultant sheet was repeatedly washed three times with distilled water. Thereafter, the sheet was immersed in a 0.01M aqueous solution of sodium borohydride for 30 minutes, and the resultant sheet was washed with distilled water to prepare a composite member. This composite member thus obtained was found having a conductive portion comprising copper.

The sheet having a conductive pattern formed therein in this manner was immersed in a plating solution of electroless copper (PS-503) for 30 minutes to apply a copper plating to the conductive portion, thus forming a wiring portion.

Then, the diameter ($\phi$ $\mu$m) of the dot and the center-to-center distance (P $\mu$m) between the neighboring apertures were varied to prepare various kind of mask. Thereafter, the conductive portion was formed in a porous sheet by the aforementioned procedures using each of these masks, the results being shown, together with the diameter $\phi$ of the dot and the center-to-center distance P, in the following Table 5.

fication type photo-sensitizer by using a mask having a beam-transmitting region which is constituted by an aggregation of circular dots arrayed in a triangular lattice pattern, the diameter $\phi$ of the dot should be confined within the range of 1 to 5 $\mu$m, and the center-to-center distance P between the neighboring dots should be confined within the range of 2 to 8 $\mu$m, thereby enabling an excellent conductive pattern to be precipitated only at a surface region of a porous sheet.

In particular, it is possible to enhance the sensitivity of the porous sheet to the beam by using a chemical amplification type photo-sensitizer as in this example.

As explained above, it is possible, according to the present invention, to provide a method for manufacturing a composite member comprising a substrate formed of a porous insulating body, wherein a via constituting a through-hole portion and a wiring formed on at least one surface of the substrate are enabled to be concurrently formed in a single process. Therefore, it is possible, according to this manufacturing method, to prevent the generation of misalignment of the vias and wirings, thus making it possible to realize a land-less via as well as a prominently enhanced densification of wirings.

The present invention would be very useful for the manufacture of various devices such as various kinds of interposers, module substrates, a multi-layered wiring board such as a mother board, sensors, etc., and therefore, would be very valuable in industrial viewpoint.

TABLE 5

| $\phi(\mu m)$ | 1.5 $\phi$ | 2 $\phi$ | 2.5 $\phi$ | 3 $\phi$ | 4 $\phi$ | 5 $\phi$ |
|---|---|---|---|---|---|---|
| 1 | Penetrated to bottom surface | ○ | ○ | ○ | ○ | ○ |
| 1.5 | Penetrated to bottom surface | ○ | ○ | ○ | ○ | Δ |
| 2 | Penetrated to bottom surface | ○ | ○ | ○ | Δ | X |
| 2.5 | Penetrated to bottom surface | ○ | ○ | Δ | X | X |
| 3 | Penetrated to bottom surface | ○ | ○ | Δ | X | X |
| 4 | Penetrated to bottom surface | ○ | ○ | Δ | X | Separately resolved |
| 5 | Penetrated to bottom surface | ○ | Penetrated to bottom surface (separately resolved) | Separately resolved | Separately resolved | Separately resolved |
| 7 | Penetrated to bottom surface (separately resolved) | Δ | Penetrated to bottom surface (separately resolved) | Penetrated to bottom surface (separately resolved) | Penetrated to bottom surface (separately resolved) | Penetrated to bottom surface (separately resolved) |
| 10 | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) |
| 15 | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) | Penetrated to bottom surface (separately resolved) |

○: A metal pattern was precipitated only at a surface region.
X: A metal pattern was not precipitated.
Δ: Although a wiring pattern was formed, the conductivity of the wiring was defective.

The following facts can be recognized from the results of Table 5. Namely, when it is desired to perform the exposure of a porous insulating body coated with a chemical ampli- Additional advantages and modifications will readily occur to those skilled in the art. Therefore, the invention is its broader aspects is not limited to the specific details and

What is claimed is:

1. A method for manufacturing a composite member comprising a porous substrate, an interfacial conductive portion where a conductive material is filled piercing through the entire thickness of the porous substrate, and a non-interfacial conductive portion where a conductive material is filled but not piercing the entire thickness of the porous substrate; said method comprising:

exposing a first region and a second region in said porous substrate using an exposure beam, the amount of exposure to said second region being not more than 50% of the amount of exposure to said first region, and an average size of voids of said porous substrate being, as expressed by a radius of gyration, 1/20 to 10 times a wavelength of said exposure beam; and forming said interfacial conductive portion and non-interfacial conductive portion by infiltrating a conductive material into said first region and said second region respectively.

2. The method for manufacturing a composite member according to claim 1, wherein said exposing a first region and a second region in said porous substrate using the exposure beam is performed through a mask comprising a first light-transmitting region for exposing said first region and a second light-transmitting region for exposing said second region, and an average transmittance of said second light-transmitting region being not more than 50% of an average transmittance of said first light-transmitting region.

3. The method for manufacturing a composite member according to claim 2, wherein the average transmittance of said first light-transmitting region of said mask is in the range of 90% to 100%.

4. The method for manufacturing a composite member according to claim 2, wherein the average transmittance of said second light-transmitting region of said mask is 8.4% or more of an average transmittance of said first light-transmitting region.

5. The method for manufacturing a composite member according to claim 2, wherein the average transmittance of said second light-transmitting region of said mask is in the range of 15% to 35% of an average transmittance of said first light-transmitting region.

6. The method for manufacturing a composite member according to claim 2, wherein said second light-transmitting region comprises an aggregation of fine patterns of which an average aperture ratio is not more than 50% of an average aperture ratio of said first light-transmitting region.

7. The method for manufacturing a composite member according to claim 6, wherein the average aperture ratio of said second light-transmitting region of said mask is 35% or less.

8. The method for manufacturing a composite member according to claim 6, wherein a size of said fine patterns of said second light-transmitting region is in the range of 0.1 $\mu$m to 10 $\mu$m.

9. The method for manufacturing a composite member according to claim 6, wherein said fine patterns of said second light-transmitting region are circular or polygonal in configuration, and said fine patterns are arranged in a triangular lattice pattern.

10. The method for manufacturing a composite member according to claim 9, wherein said fine patterns of said second light-transmitting region are circular in configuration, and a center-to-center distance between the neighboring circles is at least twice as large as the diameter of said circle.

11. The method for manufacturing a composite member according to claim 6, wherein said fine patterns of said second light-transmitting region are circular or polygonal in configuration, and said fine patterns are arranged to form a square lattice.

12. The method for manufacturing a composite member according to claim 6, wherein said fine patterns are stripe patterns having aperture ratio of not more than 50%, and the width between the neighboring stripe patterns is in the range of 0.1 $\mu$m to 10 $\mu$m.

13. A method for manufacturing a composite member comprising a porous substrate, non-interfacial conductive portions which are formed on the opposite surfaces of the porous substrate and where a conductive material is filled but not piercing the entire thickness of the porous substrate, and an interfacial conductive portion which is electrically connected with said non-interfacial conductive portions and where a conductive material is filled piercing through the entire thickness of the porous substrate; said method comprising:

disposing masks on respective of the opposite surfaces of said porous substrate, said masks each comprising a first light-transmitting region for exposing a first region of said porous substrate and a second light-transmitting region for exposing a second region on the opposite surfaces of said porous substrate, said second light-transmitting region comprising an aggregation of fine patterns, an average transmittance of said second light-transmitting region being not more than 50% of an average transmittance of said first light-transmitting region, and each of said masks aligned based on the position of said first light-transmitting region of each of said masks;

exposing said first region and said second region to an exposure beam through each of said masks, an average size of voids of said porous substrate being, as expressed by a radius of gyration, 1/20 to 10 times a wavelength of said exposure beam; and forming said interfacial conductive portion and non-interfacial conductive portion by infiltrating a conductive material into said first region and said second region respectively.

14. The method for manufacturing a composite member according to claim 13, wherein an average aperture ratio of said second light-transmitting region of said masks is 35% or less.

15. The method for manufacturing a composite member according to claim 13, wherein a size of said fine patterns of said second light-transmitting region of said masks is in the range of 0.1 $\mu$m to 10 $\mu$m.

16. The method for manufacturing a composite member according to claim 13, wherein a size of said fine patterns of said second light-transmitting region of said masks is in the range of 0.5 $\mu$m to 5 $\mu$m.

17. The method for manufacturing a composite member according to claim 13, wherein said fine patterns of said second light-transmitting region are circular or polygonal in configuration, and said fine patterns are arranged in a triangular lattice pattern.

18. The method for manufacturing a composite member according to claim 17, wherein said fine patterns of said second light-transmitting region are circular in configuration, and a center-to-center distance between neighboring circles is at least twice as large as the diameter of said circles.

19. The method for manufacturing a composite member according to claim 13, wherein said fine patterns of said second light-transmitting region are circular or polygonal in configuration, and said fine patterns are arranged in a square lattice pattern.

20. The method for manufacturing a composite member according to claim 13, wherein said fine patterns are stripe patterns having an aperture ratio of not more than 50%, and the width between the neighboring stripe patterns is in the range of 0.1 μm to 10 μm.

* * * * *